(12) United States Patent
Seto

(10) Patent No.: US 12,401,927 B2
(45) Date of Patent: Aug. 26, 2025

(54) PHOTOELECTRIC CONVERSION APPARATUS, PHOTOELECTRIC CONVERSION SYSTEM, AND MOVING BODY

(71) Applicant: CANON KABUSHIKI KAISHA, Tokyo (JP)

(72) Inventor: Daichi Seto, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 46 days.

(21) Appl. No.: 18/061,924

(22) Filed: Dec. 5, 2022

(65) Prior Publication Data

US 2023/0179883 A1    Jun. 8, 2023

(30) Foreign Application Priority Data

Dec. 7, 2021   (JP) ................................ 2021-198651

(51) Int. Cl.
*H04N 25/778* (2023.01)
*H04N 25/13* (2023.01)
*H04N 25/677* (2023.01)
*H04N 25/766* (2023.01)

(52) U.S. Cl.
CPC ......... *H04N 25/778* (2023.01); *H04N 25/134* (2023.01); *H04N 25/677* (2023.01); *H04N 25/766* (2023.01)

(58) Field of Classification Search
CPC ...... H04N 23/60; H04N 23/617; H04N 23/65; H04N 23/67; H04N 23/672; H04N 23/677; H04N 23/766; H04N 23/778; H01L 27/14603; H01L 27/14612; H01L 27/14641

See application file for complete search history.

(56) References Cited

U.S. PATENT DOCUMENTS

| | | | |
|---|---|---|---|
| 2021/0305303 A1 | 9/2021 | Onuki | |
| 2022/0046196 A1* | 2/2022 | Li | ............... H04N 25/78 |
| 2022/0367555 A1* | 11/2022 | Komoto | ............. H04N 25/00 |

FOREIGN PATENT DOCUMENTS

| JP | 2018201078 A | 12/2018 |
|---|---|---|
| WO | 2020262629 A | 12/2020 |

\* cited by examiner

*Primary Examiner* — Daniel M Pasiewicz
(74) *Attorney, Agent, or Firm* — Canon U.S.A., Inc. IP Division

(57) ABSTRACT

An apparatus includes a semiconductor layer including a conversion unit and a diffusion unit, and a plurality of wiring layers including a first wiring layer. The semiconductor layer includes a transfer transistor configured to send a signal based on a charge generated by the conversion unit to the diffusion unit, and an amplification transistor including a gate connected to the diffusion unit. The first wiring layer includes a control line configured to send a signal to drive the transfer transistor to a gate of the transfer transistor, a wire connecting the diffusion unit and the gate of the amplification transistor, and a first shield wire connected to a source or a drain of the amplification transistor and provided between the wire and the control line in a planar view.

24 Claims, 18 Drawing Sheets

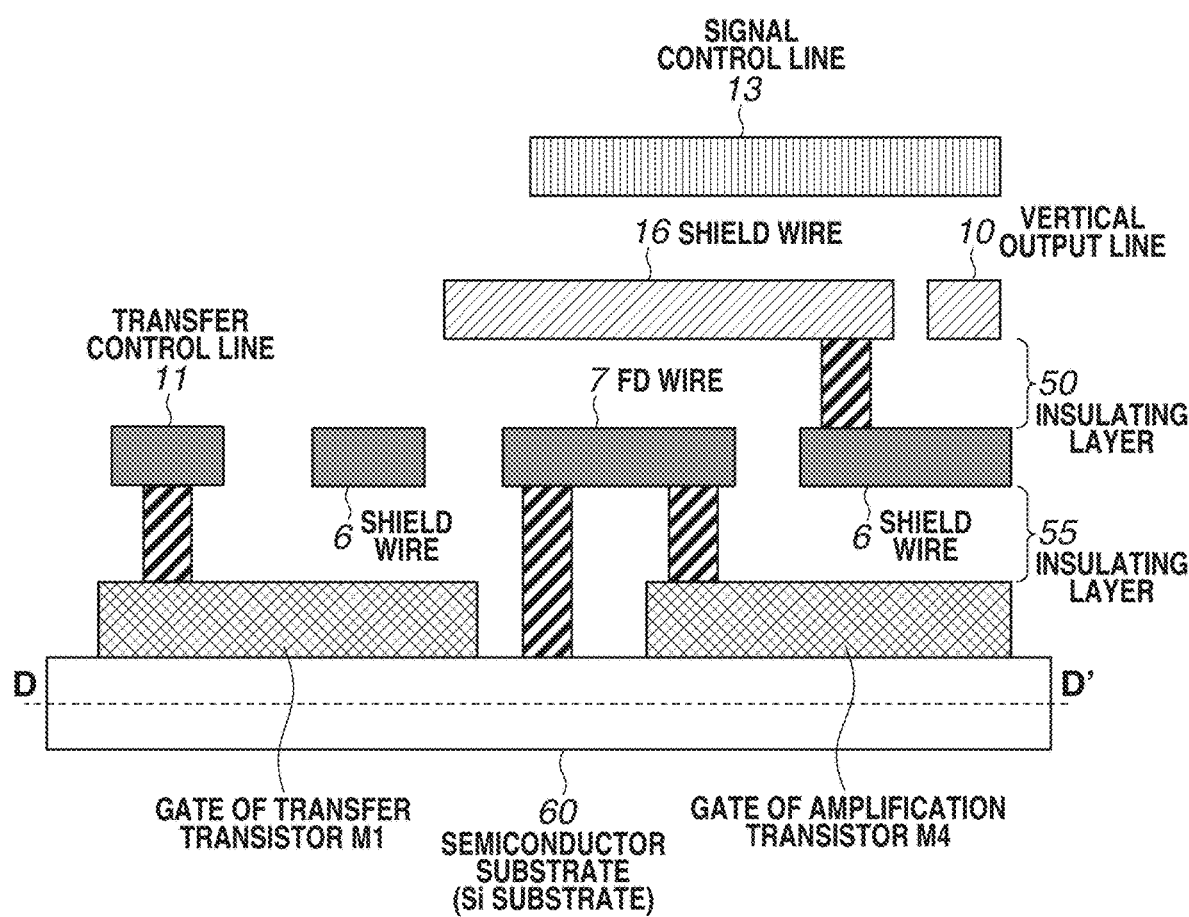

PHOTOELECTRIC CONVERSION APPARATUS, PHOTOELECTRIC CONVERSION SYSTEM, AND MOVING BODY

BACKGROUND

Technical Field

The aspect of the embodiments relates to a photoelectric conversion apparatus, a photoelectric conversion system including the photoelectric conversion apparatus, and a moving body.

Description of the Related Art

A photoelectric conversion apparatus provided with a complementary metal-oxide-semiconductor (CMOS) image sensor on a semiconductor substrate converts a charge generated by a photoelectric conversion unit into a voltage in a floating diffusion unit (FD) and outputs the voltage. Thus, if the gate of a transistor near the FD, a wire for controlling the transistor, or an output line of another pixel is close to the FD, crosstalk can occur due to capacitive coupling caused by parasitic capacitance, reducing the signal accuracy.

To reduce this crosstalk, as discussed in Japanese Patent Application Laid-Open No. 2018-201078, there is a known technique for placing a shield wire held at a fixed potential between a wire electrically connected to the gate of a transfer transistor that transfers a charge generated by a photoelectric conversion unit and a wire of FD.

In this case, the parasitic capacitance between the shield wire and the FD may cause a larger capacitance of the FD, reducing the photoelectric conversion efficiency, increasing random noise superimposed on an output signal.

SUMMARY

According to an aspect of the embodiments, an apparatus includes a semiconductor layer including a conversion unit and a diffusion unit, and a plurality of wiring layers including a first wiring layer. The semiconductor layer includes a transfer transistor configured to send a signal based on a charge generated by the conversion unit to the diffusion unit, and an amplification transistor including a gate connected to the diffusion unit. The first wiring layer includes a control line configured to send a signal to drive the transfer transistor to a gate of the transfer transistor, a wire connecting the diffusion unit and the gate of the amplification transistor, and a first shield wire connected to a source or a drain of the amplification transistor and provided between the wire and the control line in a planar view.

Further features of the disclosure will become apparent from the following description of exemplary embodiments with reference to the attached drawings.

BRIEF DESCRIPTION OF THE DRAWINGS

FIG. 16 is a cross-sectional view illustrating the photoelectric conversion apparatus according to the fifth exemplary embodiment.

DESCRIPTION OF THE EMBODIMENTS

Exemplary embodiments will be described below with reference to the drawings.

In the following exemplary embodiments, an imaging apparatus is mainly described as an example of a photoelectric conversion apparatus. The exemplary embodiments, however, are not limited to the imaging apparatus, and are also applicable to examples other than the imaging apparatus. The other examples include a distance measuring apparatus (an apparatus that measures distance using a focus detection or time of flight (ToF) technique) and a photometric apparatus (an apparatus that measures the amount of incident light).

The conductivity types of semiconductor regions and wells and dopants implanted into the semiconductor regions and the wells described in the following exemplary embodiments are merely examples, and are not limited to the conductivity types and the dopants described in the exemplary embodiments. The conductivity types and the dopants described in the exemplary embodiments can be appropriately changed, and the potentials of the semiconductor regions and the wells are appropriately changed according to these changes.

The conductivity types of transistors described in the following exemplary embodiments are merely examples, and are not limited to the conductivity types described in the exemplary embodiments. The conductivity types described in the exemplary embodiments can be appropriately changed, and the potentials of the gates, the sources, and the drains of the transistors are appropriately changed according to these changes.

For example, in a transistor that functions as a switch, the low level and the high level of potential to be supplied to the gate of the transistor may be reversed relative to the descriptions in the exemplary embodiments according to a change in the conductivity type. The conductivity types of semiconductor regions described in the following exemplary embodiments are also merely examples, and are not limited to the conductivity types described in the exemplary embodiments. The conductivity types described in the exemplary embodiments can be appropriately changed, and the potentials of the semiconductor regions are appropriately changed according to these changes.

In the specification, a "planar view" refers to a view in a direction perpendicular to the light incident surface of a semiconductor layer. A "cross-sectional view" refers to a view of a surface (a cross section) perpendicular to the light incident surface of a semiconductor layer as viewed in a direction parallel to the light incident surface. With a microscopically rough light incident surface of the semiconductor layer, a planar view is defined based on the light incident surface of the semiconductor layer when viewed macroscopically.

Figure 1:
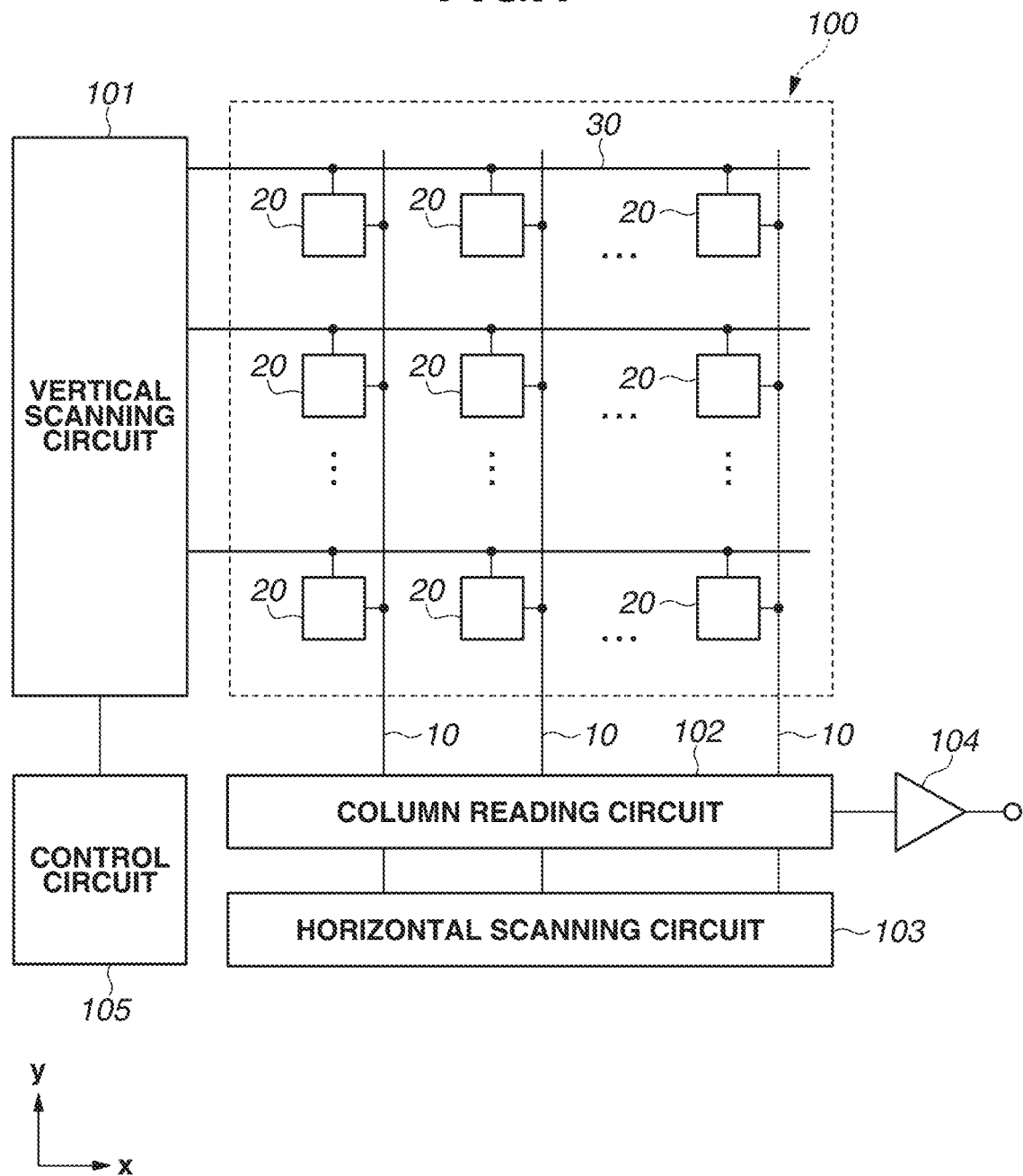
FIG. 1 is a block diagram illustrating a general configuration of a photoelectric conversion apparatus according to a first exemplary embodiment.
Figure 2:
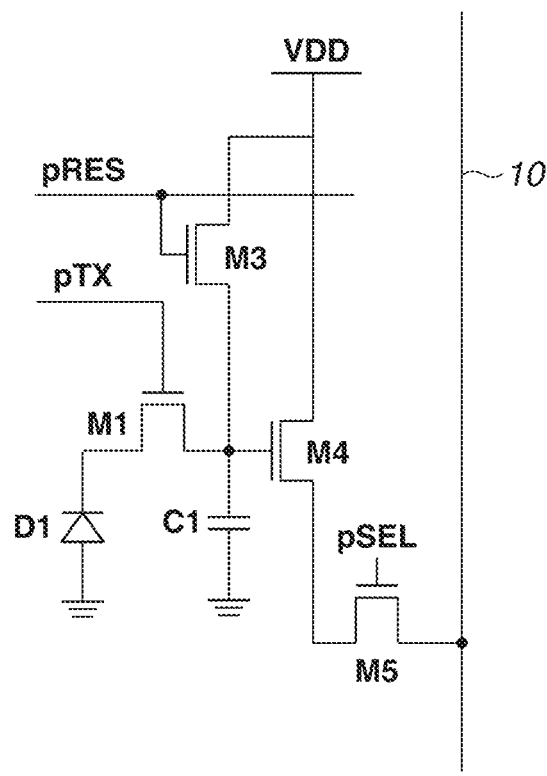
FIG. 2 is an equivalent circuit diagram illustrating a unit cell of the photoelectric conversion apparatus according to the first exemplary embodiment.
Figure 3:
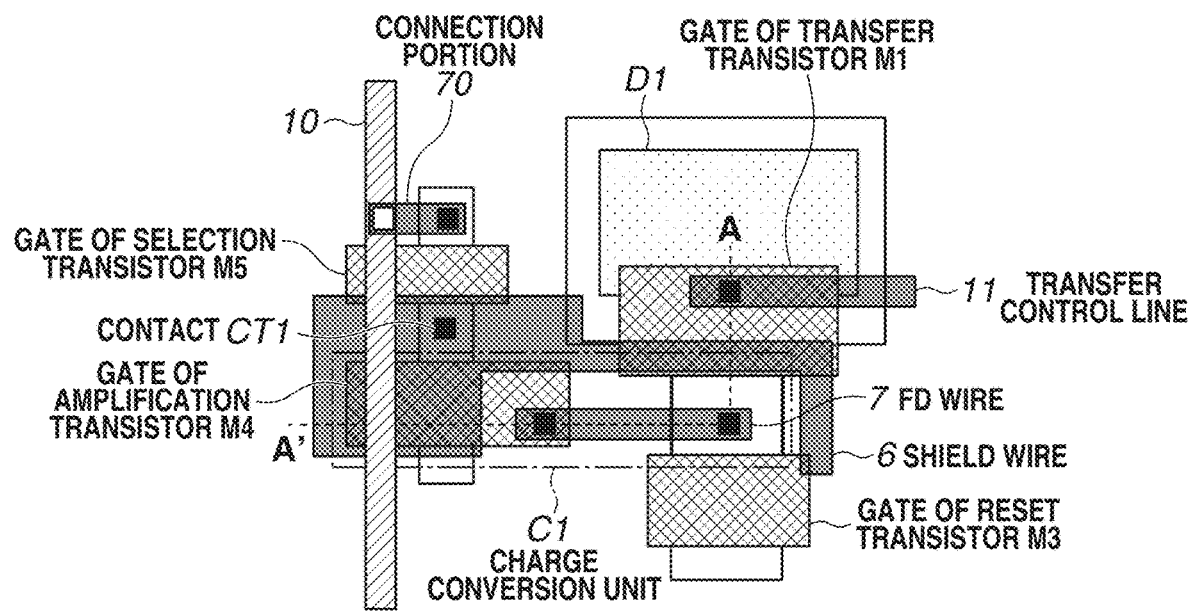
FIG. 3 is a plan view of the unit cell of the photoelectric conversion apparatus according to the first exemplary embodiment.
Figure 4:
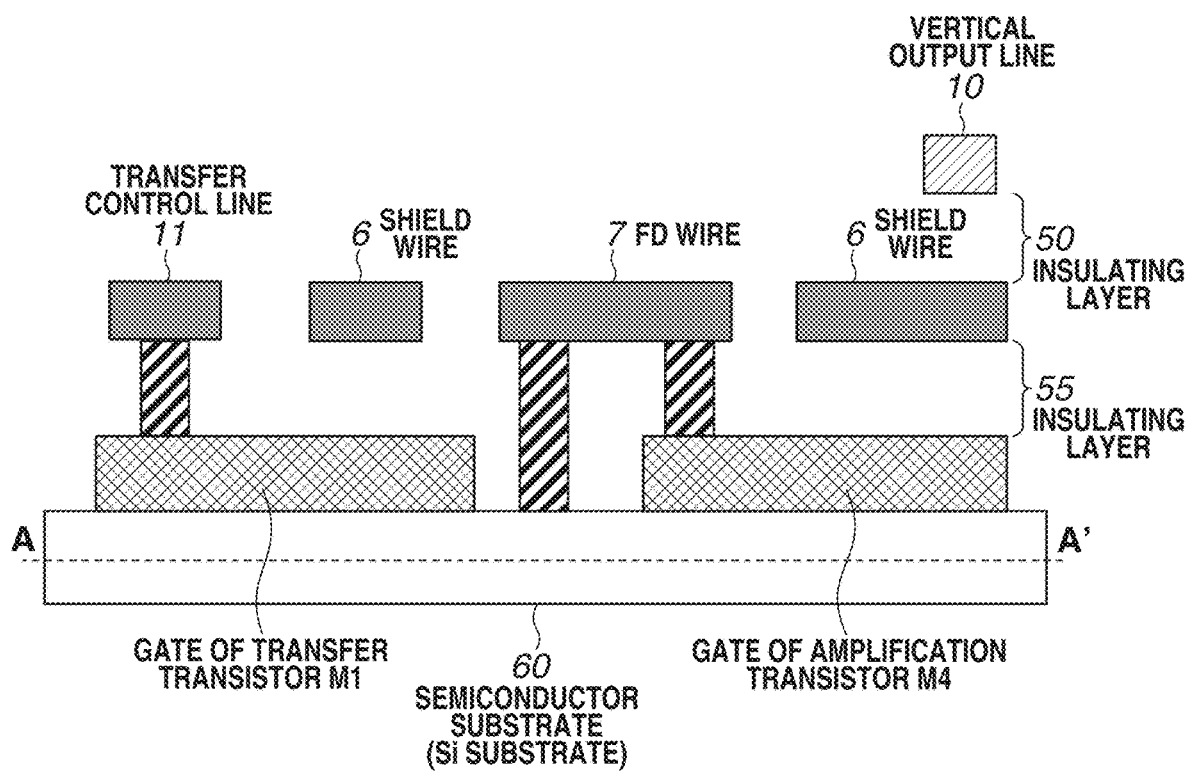
FIG. 4 is a cross-sectional view illustrating the photoelectric conversion apparatus according to the first exemplary embodiment.

With reference to FIGS. 1 to 4, a first exemplary embodiment of the disclosure will be described. FIG. 1 is a schematic diagram illustrating the configuration of a photoelectric conversion apparatus according to the present exemplary embodiment. FIG. 2 is an equivalent circuit diagram illustrating the photoelectric conversion apparatus according to the present exemplary embodiment. FIG. 3 is a plan view of a pixel included in the photoelectric conversion apparatus according to the present exemplary embodiment. FIG. 4 is a cross-sectional view along an A-A' line in FIG. 3.

The configuration of the photoelectric conversion apparatus according to the present exemplary embodiment will be described with reference to FIG. 1. The photoelectric conversion apparatus according to the present exemplary embodiment includes a pixel array 100 where each pixel includes a photodiode D1, a vertical scanning circuit 101, a column reading circuit 102, a horizontal scanning circuit 103, an output circuit 104, and a control circuit 105 in a semiconductor substrate including the semiconductor layer and the wiring layer.

The pixel array 100 includes a plurality of pixels 20 arranged in an array. A vertical output line 10 is disposed for a single column of pixels 20, and signals generated by the pixels 20 are output via the vertical output line 10. The number of pixels 20 included in the pixel array 100 is not particularly limited. For example, as in a typical digital camera, the pixel array 100 may include pixels in several thousands of rows×several thousands of columns. In some embodiments, the pixel array 100 consists of a plurality of pixels arranged in a single row or a single column.

Pixels 20 in a single row arranged over a plurality of columns are connected to the vertical scanning circuit 101 via a corresponding control line 30. The vertical scanning circuit 101 controls charge accumulation periods of the pixels 20.

The column reading circuit 102 includes a plurality of column circuits arranged corresponding to the vertical output lines 10 in the respective columns. Each of the column circuits outputs the signals obtained by processing signals output from the pixels 20 to the vertical output line 10 to the output circuit 104. This processing refers to, for example, analog-to-digital (AD) conversion or amplification.

The horizontal scanning circuit 103 sequentially selects a column circuit from the column circuits included in the column reading circuit 102. Thus, signals held in the column circuits are sequentially output to the output circuit 104.

The output circuit 104 outputs a signal to outside the photoelectric conversion apparatus.

The control circuit 105 is connected to the vertical scanning circuit 101, the column reading circuit 102, and the horizontal scanning circuit 103 via driving lines and supplies a driving signal.

FIG. 2 is an equivalent circuit diagram illustrating each of the pixels 20 illustrated in FIG. 1. In the following description, a charge accumulated in a photodiode as a photoelectric conversion unit is electrons, and all the transistors included in the pixel 20 are N-type transistors. The charge accumulated in the photodiode is not limited to electrons, and the charge accumulated in the photodiode may be holes. In this case, the transistors of the pixel 20 may be P-type transistors. That is, the prescriptions of the conductivity types used in the following description can be changed according to the polarity of a charge treated as a signal.

The pixel 20 includes a photodiode D1 as a photoelectric conversion unit, a transfer transistor M1, a charge conversion unit C1, a reset transistor M3, an amplification transistor M4, and a selection transistor M5.

The photodiode D1 is a photoelectric conversion unit that converts incident light into a charge.

The transfer transistor M1 is provided on an electrical path between the photodiode D1 and a node to which the charge conversion unit C1, the reset transistor M3, and the amplification transistor M4 are connected.

One end that is the source or the drain of the reset transistor M3 is connected to the node shared with the charge conversion unit C1 and the amplification transistor M4, and a power supply voltage VDD is supplied to the other end.

The gate of the amplification transistor M4 is connected to the node shared with the charge conversion unit C1 and the source or the drain of the reset transistor M3. The power supply voltage VDD is supplied to one end that is the source or the drain of the amplification transistor M4, and the other end is connected to one end that is the source or the drain of the selection transistor M5.

The selection transistor M5 is provided on an electrical path between the amplification transistor M4 and the vertical output line 10. In other words, the amplification transistor M4 is electrically connected to the vertical output line 10 via the selection transistor M5.

The charge conversion unit C1 corresponds to a floating diffusion unit and is a capacitor including a floating diffusion capacitance provided in the semiconductor substrate and the parasitic capacitance of the electrical path extending from the transfer transistor M1 through the floating diffusion capacitance to the amplification transistor M4. Actually, the floating diffusion capacitance is provided as a wiring capacitance, and in the following description, a wire forming a wiring capacitance will also be referred to as a "floating diffusion (FD) wire".

A signal pRES, a signal pTx, and a signal pSEL in FIG. 2 are control signals supplied from the vertical scanning circuit 101 illustrated in FIG. 1 to the pixel 20 via the control line 30. The signal pTx is fed to the gate of the transfer transistor M1. The signal pRES is fed to the gate of the reset transistor M3. The signal pSEL is fed to the gate of the selection transistor M5.

An electric current source (not illustrated) is connected to the vertical output line 10. The signal pSEL fed to the gate of the selection transistor M5 reaches an active level, thereby turning on the selection transistor M5. Consequently, an electric current is supplied from the electric current source to the amplification transistor M4. In the pixel 20, a source follower circuit is formed of the power supply voltage VDD, the amplification transistor M4, and the electric current source (not illustrated) connected to the vertical output line 10. This source follower circuit outputs a signal based on the potential of the charge conversion unit C1 to the vertical output line 10 via the selection transistor M5.

FIG. 3 is a plan view illustrating the layout of the pixel 20 illustrated in FIG. 2. Like numbers refer to like members having the same functions as those of the members illustrated in FIG. 2. The pixel 20 illustrated in FIG. 3 further includes a shield wire 6, an FD wire 7, and a transfer control line 11.

The shield wire 6, the FD wire 7, and the transfer control line 11 are provided in the same wiring layer. The wiring layer in which these wires are provided is a first wiring layer.

The shield wire 6 is a wire for shielding an FD from another wire and is placed between the FD wire 7 and the transfer control line 11 in a planar view. The shield wire 6 is connected to the source of the amplification transistor M4 by a contact CT1. Thus, the potential of the source of the amplification transistor M4 is supplied to the shield wire 6. In other words, in the first wiring layer, a wire having a potential different from those of the FD wire 7 and the shield wire 6 is not placed between the FD wire 7 and the shield wire 6.

The FD wire 7 is a wire for electrically connecting the transfer transistor M1 to the reset transistor M3 and the amplification transistor M4. The wiring capacitance of the FD wire 7 functions as a floating diffusion capacitance.

The transfer control line 11 is a wire for supplying the control signal pTx to the gate of the transfer transistor M1.

FIG. 4 is a cross-sectional view of a region through which an A-A' line illustrated in FIG. 3 runs, the cross-sectional view perpendicular to a first surface (the front surface or the upper surface) of a semiconductor substrate 60.

In the cross-sectional view in FIG. 4, the shield wire 6 is provided between the transfer control line 11 and the FD wire 7 in the same wiring layer and between the vertical output line 10 and the FD wire 7.

On the first surface of the semiconductor substrate 60, the gate of the transfer transistor M1 and the gate of the amplification transistor M4 are provided.

An insulating layer 55 is provided between the first wiring layer in which the shield wire 6 is provided and the gate of the transfer transistor M1 and the gate of the amplification transistor M4. The shield wire 6 overlaps at least a part of the gate of the amplification transistor M4 in a planar view in a direction perpendicular to the first surface of the substrate 60. The shield wire 6 also overlaps at least a part of the gate of the transfer transistor M1 in a planar view.

As illustrated in FIG. 3, the selection transistor M5 of the pixel 20 is connected to the vertical output line 10 via a connection portion 70. The vertical output line 10 is provided in a second wiring layer separated from the shield wire 6 by an insulating layer 50, and the shield wire 6 is provided between the vertical output line 10 and the gate of the amplification transistor M4. The shield wire 6 is arranged overlapping the gate of the amplification transistor M4 in a planar view in a direction perpendicular to the first surface of the substrate 60. The shield wire 6 is connected to the output node of the amplification transistor M4.

In each of the pixels 20 included in the photoelectric conversion apparatus according to the present exemplary embodiment, a voltage is supplied to the gate of the transfer transistor M1 via the transfer control line 11 illustrated in FIG. 3, thereby controlling turning on and off the transfer transistor M1 and transferring a signal based on a charge accumulated in the photodiode D1. Without the shield wire 6, capacitive coupling occurs due to the parasitic capacitance between the FD wire 7 and the transfer control line 11. This capacitive coupling varies the potential of the photodiode D1, reducing the signal accuracy due to crosstalk.

On the other hand, the photoelectric conversion apparatus according to the present exemplary embodiment can reduce the parasitic capacitance between the FD wire 7 and the transfer control line 11 with the shield wire 6 to which the output potential of the amplification transistor M4 is supplied.

With the shield wire 6 provided, parasitic capacitance can occur between the shield wire 6 and the FD wire 7. If this parasitic capacitance causes a large capacitance of the charge conversion unit C1, which is obtained by adding up the floating diffusion capacitance that is the wiring capacitance of the FD wire 7 and the parasitic capacitance, that will lead to a decrease in charge conversion efficiency of the FD, and an increase in random noise superimposed on an output signal. In the present exemplary embodiment, the potential of the shield wire 6 is set to the same potential as the output of the amplification transistor M4, whereby the potentials of the shield wire 6 and the FD wire 7 fluctuate in phase. In this configuration, the output of the amplification transistor M4 follows the voltage on the FD, producing a substantially small parasitic capacitance of the FD. Further, this metal shield blocks almost all unnecessary electrical coupling between adjacent FD units, reducing electrical crosstalk. This provides an improved effect of the charge conversion efficiency due to a reduction in the capacitance of the charge conversion unit C1 and a reduced effect of random noise superimposed on an output signal.

Further, in the photoelectric conversion apparatus according to the present exemplary embodiment, the shield wire 6 is connected to the output node of the amplification transistor M4. The supply of a predetermined power supply voltage to the shield wire 6 involves placing a wire for supplying the predetermined power supply voltage to the shield wire 6. The arrangement of this wire can entail a decrease in the opening area of the photodiode D1, a reduction in the degree of freedom in wiring layout or element layout, or an increase in cost due to an increase in the number of manufacturing steps. In the present exemplary embodiment, the potential to be supplied to the shield wire 6 is set to the potential of the output node of the amplification transistor M4, reducing the parasitic capacitance between the FD wire 7 and the transfer control line 11 without adding a wire for supplying a potential to the shield wire 6.

Variation of First Exemplary Embodiment

A variation of the first exemplary embodiment of the disclosure will be described with reference to FIG. 5. FIG.

5 is a plan view illustrating a photoelectric conversion apparatus according to the present variation. The photoelectric conversion apparatus according to the present variation is different from the photoelectric conversion apparatus illustrated in FIG. 3 in the shape of the shield wire 6.

Figure 5:
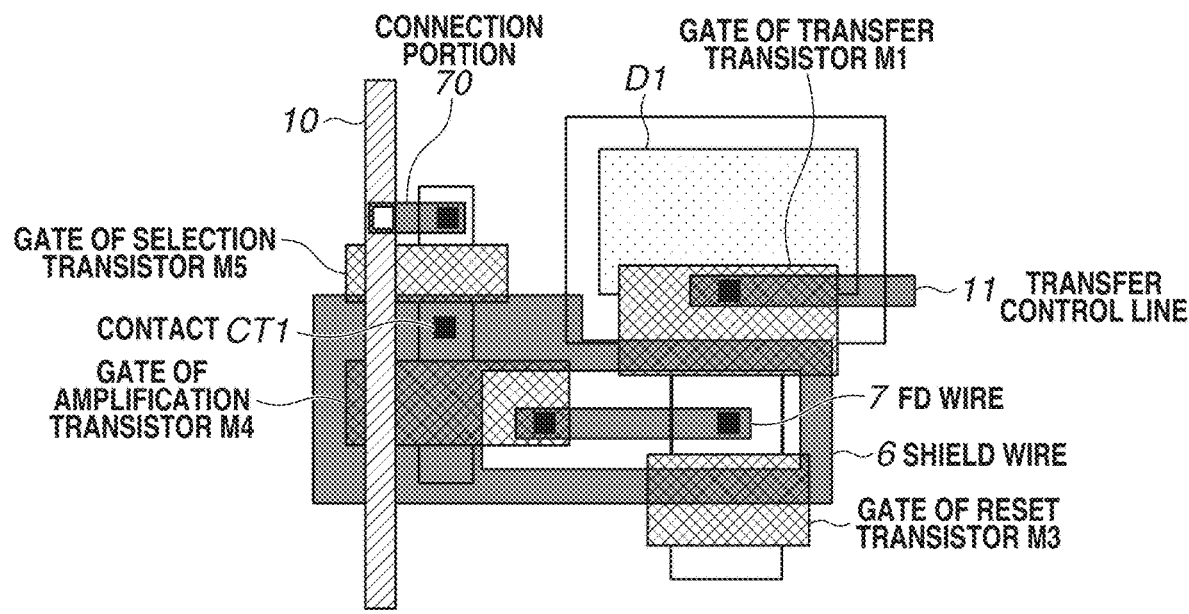
FIG. 5 is a plan view illustrating a photoelectric conversion apparatus according to a variation of the first exemplary embodiment.

As illustrated in FIG. 5, the shape and the placement of the shield wire 6 is not limited to the space between the FD wire 7 and the transfer control line 11. The shield wire 6 may be placed around the four sides of the FD wire 7 in a planar view. This layout can reduce the parasitic capacitance between the FD wire 7 and a wire disposed in a wiring layer at the same level as that of the FD wire 7.

The edge shape of the shield wire 6 close to the FD wire 7 is not limited to a rectangle having four sides surrounding the four sides of the FD wire 7 as illustrated in FIG. 5, and for example, may be a polygon having five or more sides surrounding the FD wire 7. This edge shape is not limited to a shape in which the shield wire 6 annularly surrounds the FD wire 7, and may be a shape in which the shield wire 6 has sides opposed to three sides of the FD wire 7 and does not have a side opposed to the other side of the FD wire 7.

A second exemplary embodiment of the disclosure will be described with reference to FIGS. 6 and 7.

Figure 6:
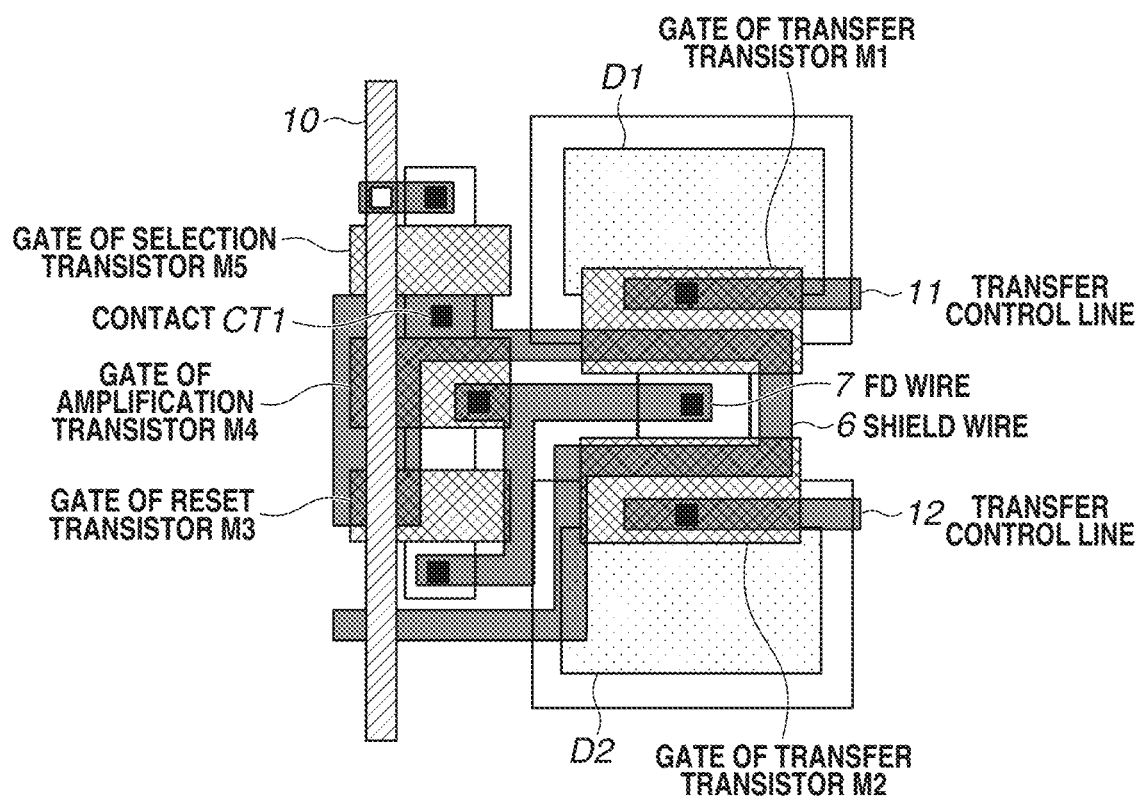
FIG. 6 is a plan view illustrating a photoelectric conversion apparatus according to a second exemplary embodiment.

FIG. 6 is a plan view of pixels included in a photoelectric conversion apparatus according to the present exemplary embodiment. FIG. 7 is an equivalent circuit diagram illustrating the pixels included in the photoelectric conversion apparatus according to the present exemplary embodiment.

The photoelectric conversion apparatus according to the present exemplary embodiment has a structure similar to that of the photoelectric conversion apparatus according to the first exemplary embodiment, except that the structure of each pixel 20 is different. Thus, the structure of each pixel 20 will be mainly described here.

Figure 7:
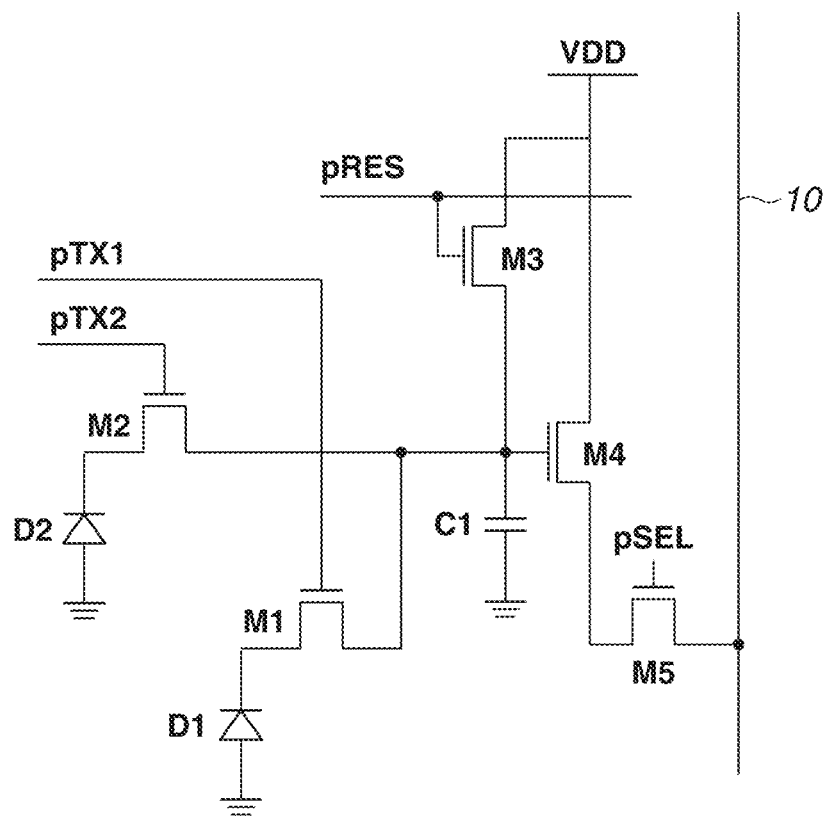
FIG. 7 is an equivalent circuit diagram illustrating a unit cell of the photoelectric conversion apparatus according to the second exemplary embodiment.

As illustrated in FIGS. 6 and 7, in the present exemplary embodiment, two pixels 20 share a single FD wire 7. That is, in the photoelectric conversion apparatus according to the first exemplary embodiment, a single photoelectric conversion unit D1, a single transfer transistor M1, and a single transfer control line 11 are placed for a single charge conversion unit C1. On the other hand, in the photoelectric conversion apparatus according to the present exemplary embodiment, a set of a first photoelectric conversion unit D1, a transfer transistor M1, and a transfer control line 11 and a set of a second photoelectric conversion unit D2, a transfer transistor M2, and a transfer control line 12 are placed line-symmetrically across an FD wire 7 for a single floating diffusion unit. Between each of the transfer control lines 11 and 12 and the FD wire 7, a shield wire 6 is provided in the same wiring layer as the transfer control lines 11 and 12 and the FD wire 7.

In the photoelectric conversion apparatus according to the present exemplary embodiment, two or more photoelectric conversion units are disposed for a single floating diffusion unit, allowing a reduction of the occupancy of floating diffusion units in the pixels 20 compared with the configuration according to the first exemplary embodiment. This increases the areas of photoelectric conversion units in the pixels 20, providing an extended dynamic range.

FIG. 7 is an equivalent circuit diagram illustrating the circuits of the two pixels 20 that share the floating diffusion layer illustrated in FIG. 6. The two pixels 20 according to the present exemplary embodiment include the photodiodes D1 and D2 as photoelectric conversion units, the transfer transistors M1 and M2, a charge conversion unit C1, a reset transistor M3, an amplification transistor M4, and a selection transistor M5. The transfer transistors M1 and M2 are provided on electrical paths between the photodiodes D1 and D2 and a node to which the charge conversion unit C1, the reset transistor M3, and the amplification transistor M4 are connected.

Voltages are supplied to the gate (a first gate) of the transfer transistor M1 and the gate (a second gate) of the transfer transistor M2 via the transfer control line 11 (a first transfer control line) and the transfer control line 12 (a second transfer control line) illustrated in FIG. 6, thereby transferring charges accumulated in the photodiodes D1 and D2, respectively. The photoelectric conversion apparatus according to the present exemplary embodiment includes the shield wire 6. This can reduce the parasitic capacitance between the FD wire 7 and the transfer control lines 11 and 12 as compared with a case where the shield wire 6 is not provided. This configuration reduces or prevents the decrease in signal accuracy due to crosstalk attributed to fluctuations of the potentials of the photodiodes D1 and D2 caused by capacitive coupling due to the parasitic capacitance between the FD wire 7 and the transfer control lines 11 and 12.

Further, in the photoelectric conversion apparatus according to the present exemplary embodiment, the shield wire 6 is connected to the output node of the amplification transistor M4, causing the potential of the shield wire 6 to be the same potential as the output of the amplification transistor M4. This allows the potentials of the shield wire 6 and the FD wire 7 to fluctuate in phase. The output of the amplification transistor M4 follows the voltage on the FD, producing a substantially small parasitic capacitance of the FD wire 7. This provides an improved effect of the charge conversion efficiency due to a reduction in the capacitance of the charge conversion unit C1 and a reduced effect of random noise superimposed on an output signal.

In the present exemplary embodiment, the shield wire 6 is connected to the output node of the amplification transistor M4, which supplies a potential to the shield wire 6. Thus, this configuration has the effect of suitably reducing the parasitic capacitance between the FD wire 7 and the transfer control lines 11 and 12 without adding a wire for supplying a potential to the shield wire 6.

A third exemplary embodiment of the disclosure will be described with reference to FIGS. 8 to 10.

Figure 8:
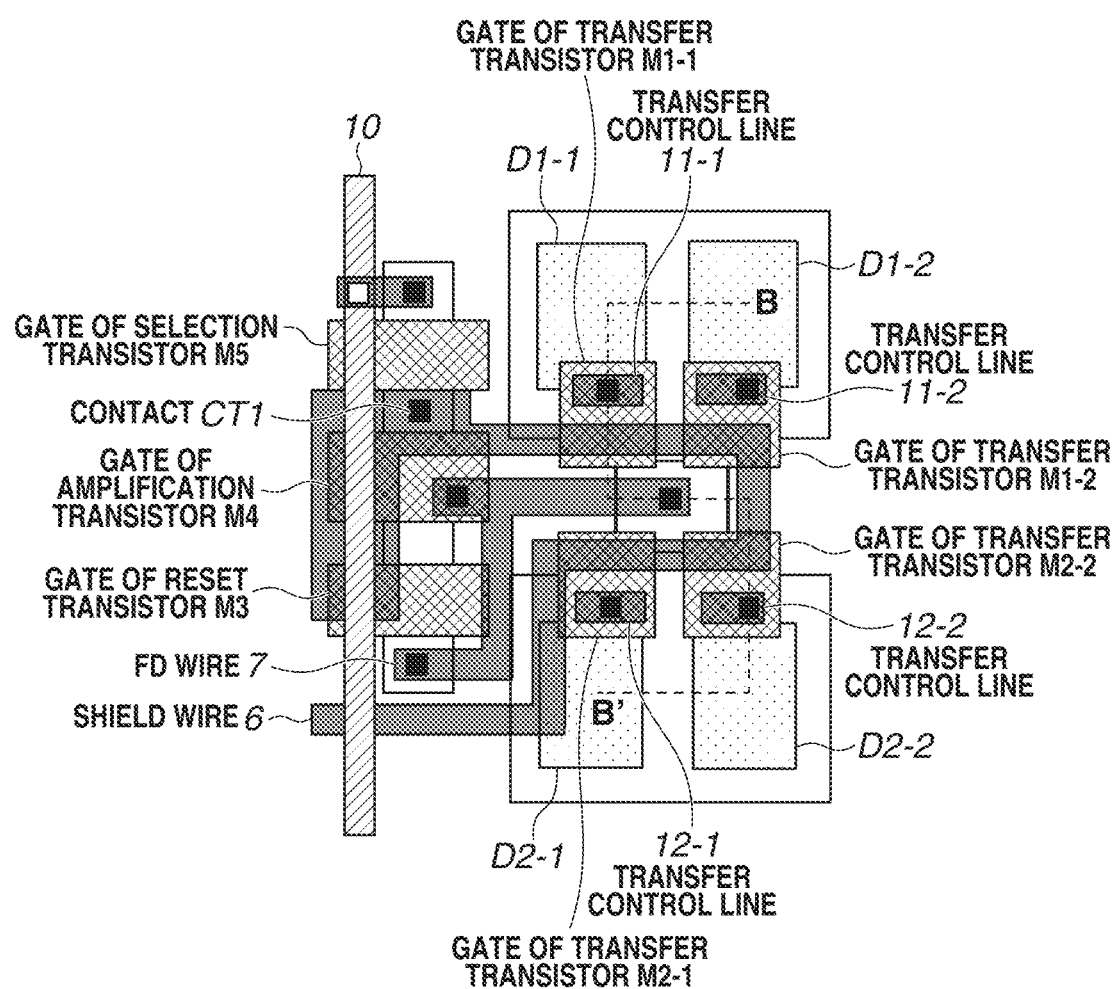
FIG. 8 is a plan view illustrating a photoelectric conversion apparatus according to a third exemplary embodiment.

FIG. 8 is an enlarged plan view of pixels included in a photoelectric conversion apparatus according to the present exemplary embodiment.

Figure 9:
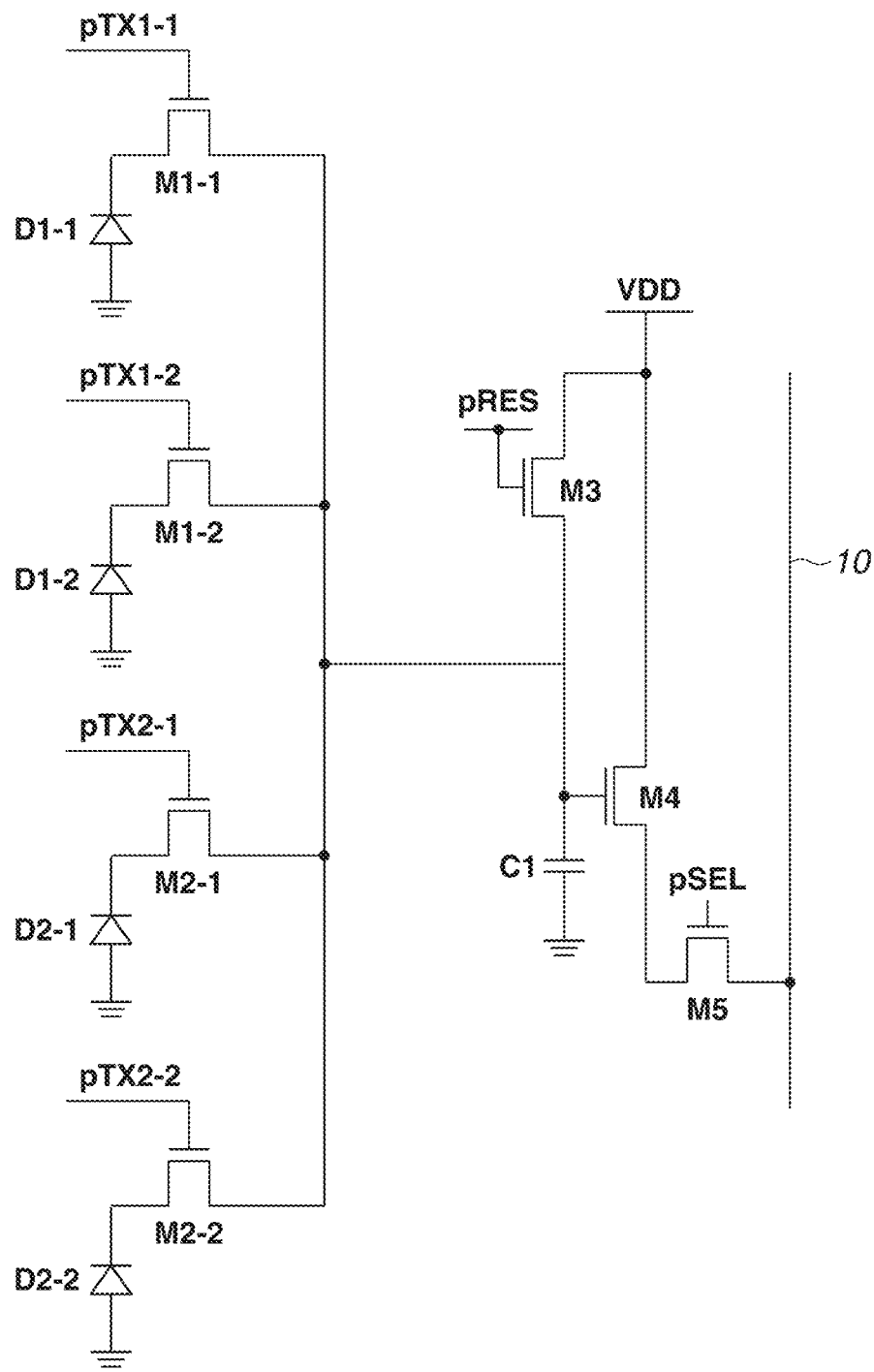
FIG. 9 is an equivalent circuit diagram illustrating a unit cell of the photoelectric conversion apparatus according to the third exemplary embodiment.

FIG. 9 is an equivalent circuit diagram illustrating the photoelectric conversion apparatus according to the present exemplary embodiment. FIG. 10 is a cross-sectional view of a region through which a B-B' line illustrated in FIG. 8 runs, the cross-sectional view perpendicular to a first surface (the front surface or the upper surface) of a semiconductor substrate 60.

The photoelectric conversion apparatus according to the present exemplary embodiment has a structure similar to that of the photoelectric conversion apparatus according to the second exemplary embodiment, except that the structure of each pixel 20 is different. Thus, the structure of each pixel 20 will be mainly described here.

As illustrated in FIGS. 8 and 9, in the present exemplary embodiment, two pixels 20 each including two photoelectric conversion units share a single FD wire. That is, four photoelectric conversion units share a single floating diffusion unit.

In the photoelectric conversion apparatus according to the second exemplary embodiment, two photoelectric conversion units D1 and D2, two transfer transistors M1 and M2, and two transfer control lines 11 and 12 are placed for a single floating diffusion unit. In contrast, in the photoelectric conversion apparatus according to the present exemplary embodiment, as illustrated in FIG. 8, photoelectric conversion units D1-1, D1-2, D2-1, and D2-2 are placed for a single floating diffusion unit in a planar view. Transfer transistors M1-1, M1-2, M2-1, and M2-2 and transfer control lines 11-1, 11-2, 12-1, and 12-2 are also placed for the single floating diffusion unit. Specifically, a shield wire 6 is provided between each of the transfer control lines 11-1, 11-2, 12-1, and 12-2 and an FD wire 7 in a planar view. The shield wire 6 is provided in the same wiring layer as the transfer control lines 11-1, 11-2, 12-1, and 12-2 and the FD wire 7.

FIG. 9 is an equivalent circuit diagram illustrating the circuits of the two pixels 20 that share the floating diffusion layer illustrated in FIG. 8.

In FIG. 9, the pixels 20 include the photodiodes D1-1, D1-2, D2-1, and D2-2 as photoelectric conversion units. Further, the pixels 20 include the transfer transistors M1-1, M1-2, M2-1, and M2-2, a charge conversion unit C1, a reset transistor M3, an amplification transistor M4, and a selection transistor M5.

The transfer transistors M1-1, M1-2, M2-1, and M2-2 are provided on electrical paths between the photodiodes D1-1, D1-2, D2-1, and D2-2 and a node to which the charge conversion unit C1, the reset transistor M3, and the amplification transistor M4 are connected.

Figure 10:
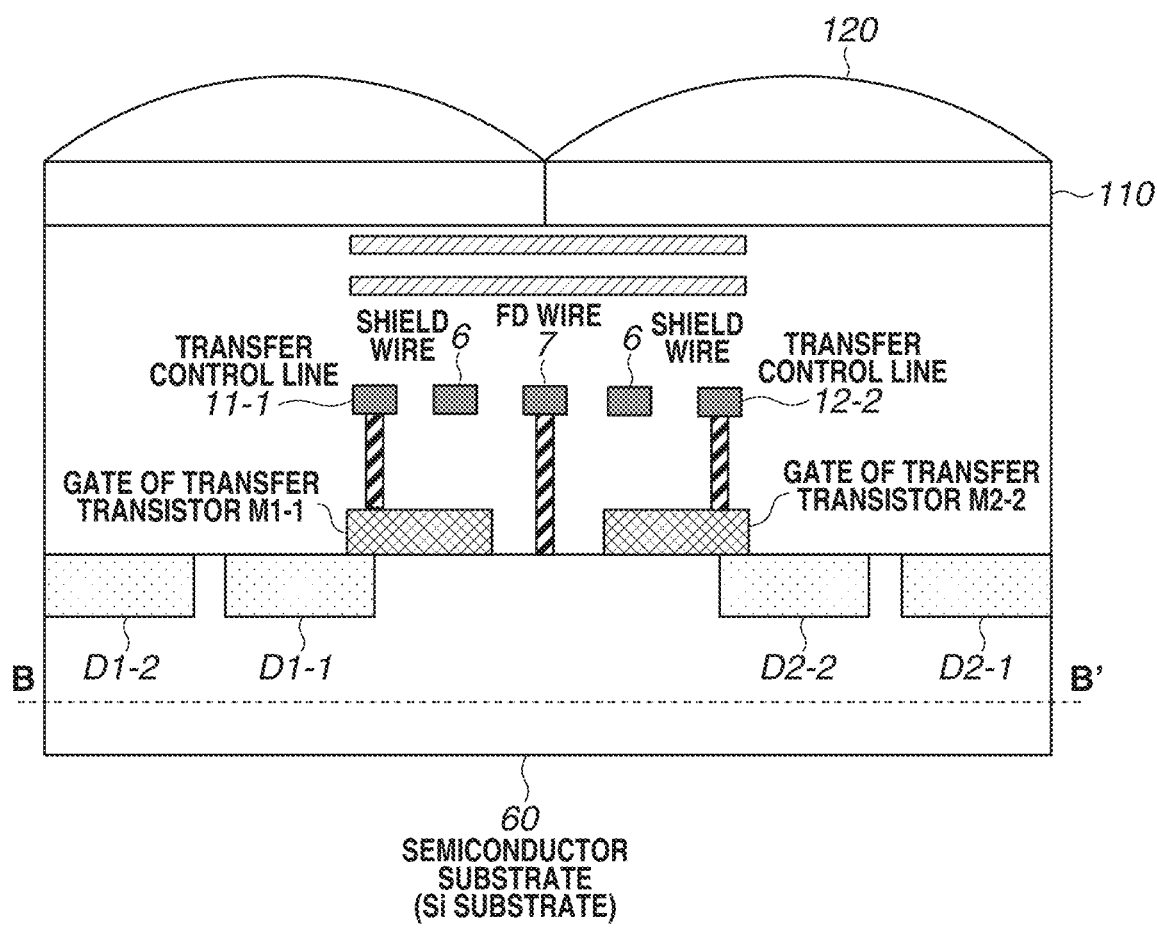
FIG. 10 is a cross-sectional view illustrating the photoelectric conversion apparatus according to the third exemplary embodiment.

FIG. 10 is a cross-sectional view of the region through which the B-B' line illustrated in FIG. 8 runs, the cross-sectional view perpendicular to the first surface of the semiconductor substrate 60.

In FIG. 10, the gates of the transfer transistors M1-1 and M2-2 are provided on the front surface (the upper surface) as the first surface of the semiconductor substrate 60. The photodiodes D1-1, D1-2, D2-1, and D2-2 are provided in the semiconductor substrate 60.

In a first wiring layer among a plurality of wiring layers, the shield wire 6 is provided between the transfer control line 11-1 and the FD wire 7 and between the transfer control line 12-2 and the FD wire 7. A single color filter 110 and a single microlens 120 are provided on each pixel 20 (two photoelectric conversion units).

In the present exemplary embodiment, a plurality of photodiodes is disposed for a single microlens 120. That is, light having passed through a single microlens 120 is incident on both the photodiodes D1-1 and D1-2. A signal processing unit (not illustrated) that processes a signal of the photoelectric conversion apparatus can perform focus detection by a phase difference detection method using a charge accumulated in the photodiode D1-1 and a charge accumulated in the photodiode D1-2. Similarly, the signal processing unit can perform focus detection by the phase difference detection method using a charge accumulated in each of the photodiodes D2-1 and D2-2 on which light is incident.

Voltages are supplied to the gates of the transfer transistors M1-1, M1-2, M2-1, and M2-2 via the transfer control lines 11-1, 11-2, 12-1, and 12-2 illustrated in FIG. 8, transferring charges accumulated in the photodiodes D1-1, D1-2, D2-1, and D2-2, respectively.

The photoelectric conversion apparatus according to the present exemplary embodiment includes the shield wire 6. This can reduce the parasitic capacitance between the FD wire 7 and the transfer control lines 11-1, 11-2, 12-1, and 12-2 as compared with a case where the shield wire 6 is not provided.

Thus, this configuration reduces or prevents the decrease in signal accuracy due to crosstalk attributed to fluctuations of potentials of the photodiodes D1-1, D1-2, D2-1, and D2-2 caused by capacitive coupling due to the parasitic capacitance between the FD wire 7 and the transfer control lines 11-1, 11-2, 12-1, and 12-2.

Further, in the photoelectric conversion apparatus according to the present exemplary embodiment, the shield wire 6 is connected to the output node of the amplification transistor M4, causing the potential of the shield wire 6 to be the same potential as the output of the amplification transistor M4. This allows the potentials of the shield wire 6 and the FD wire 7 to fluctuate in phase. In this configuration, the output of the amplification transistor M4 follows the voltage on the FD, producing a substantially small parasitic capacitance of the FD wire 7. This provides an improved effect of the charge conversion efficiency due to a reduction in the capacitance of the charge conversion unit C1 and a reduced effect of random noise superimposed on an output signal.

In the present exemplary embodiment, the shield wire 6 is connected to the output node of the amplification transistor M4, which supplies a potential to the shield wire 6. This configuration has the effect of suitably reducing the parasitic capacitance between the FD wire 7 and the transfer control lines 11-1, 11-2, 12-1, and 12-2 without adding a wire for supplying a potential to the shield wire 6.

A fourth exemplary embodiment of the disclosure will be described with reference to FIGS. 11 to 14.

Figure 11:
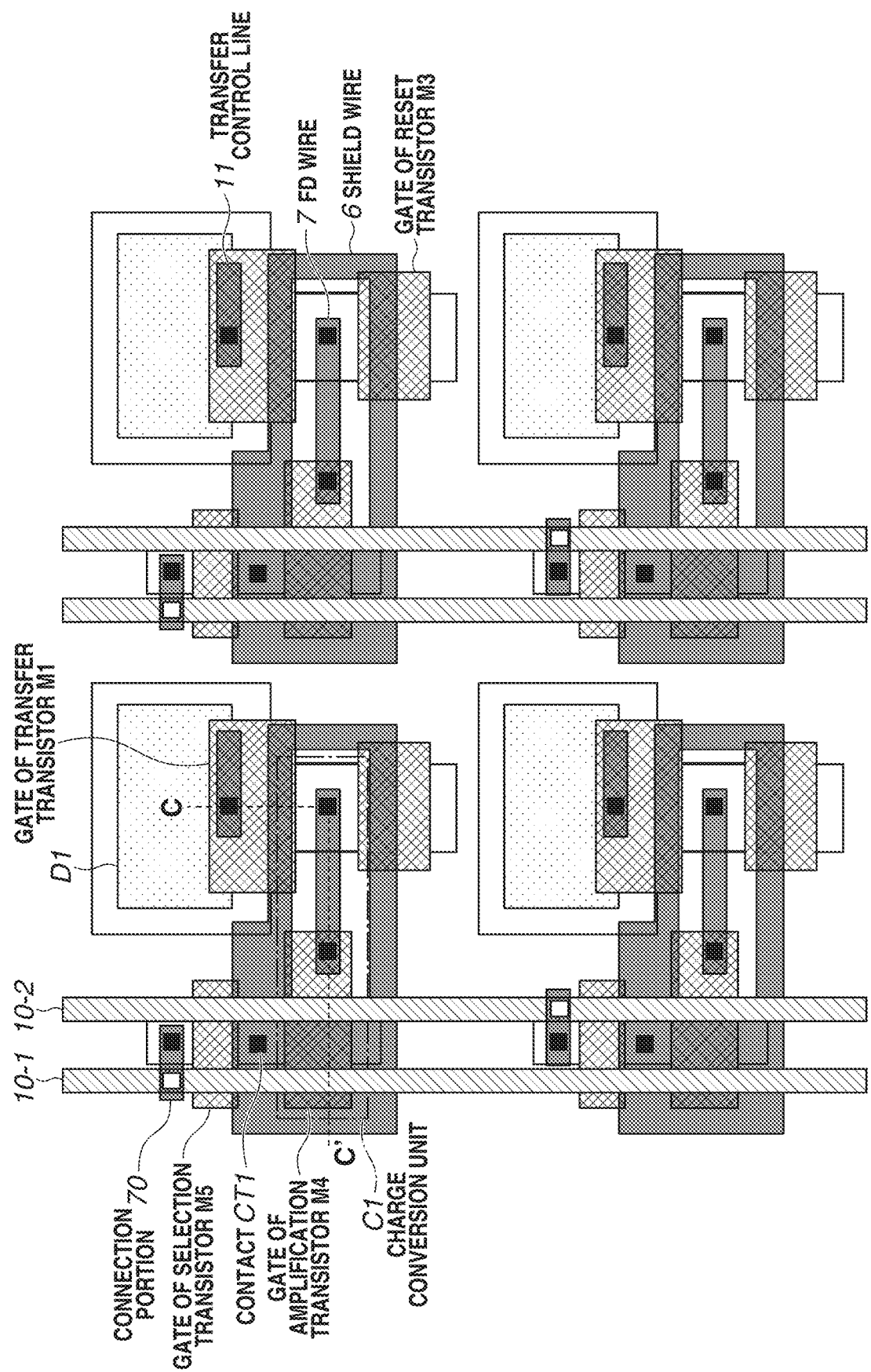
FIG. 11 is a plan view illustrating a photoelectric conversion apparatus according to a fourth exemplary embodiment.
Figure 12:
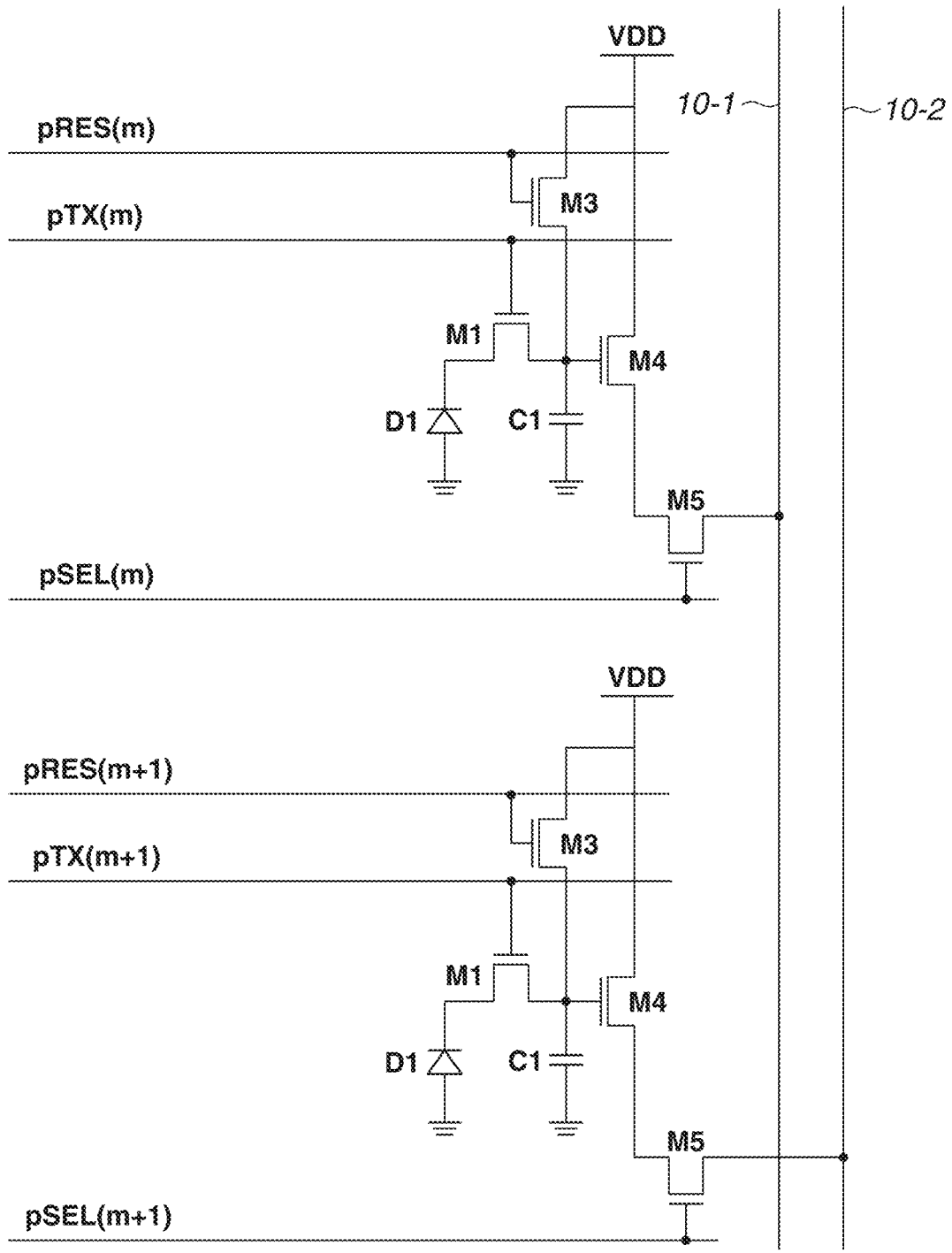
FIG. 12 is an equivalent circuit diagram illustrating a unit cell of the photoelectric conversion apparatus according to the fourth exemplary embodiment.
Figure 13:
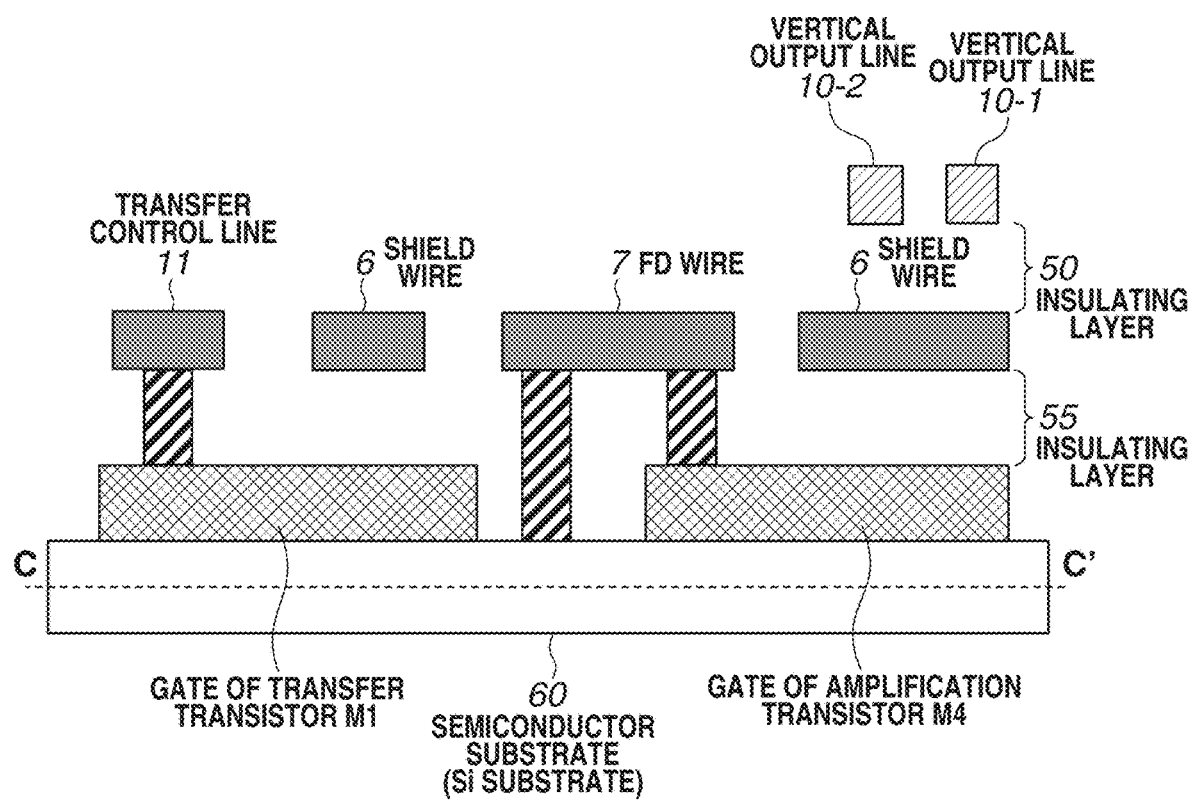
FIG. 13 is a cross-sectional view illustrating the photoelectric conversion apparatus according to the fourth exemplary embodiment.
Figure 14:
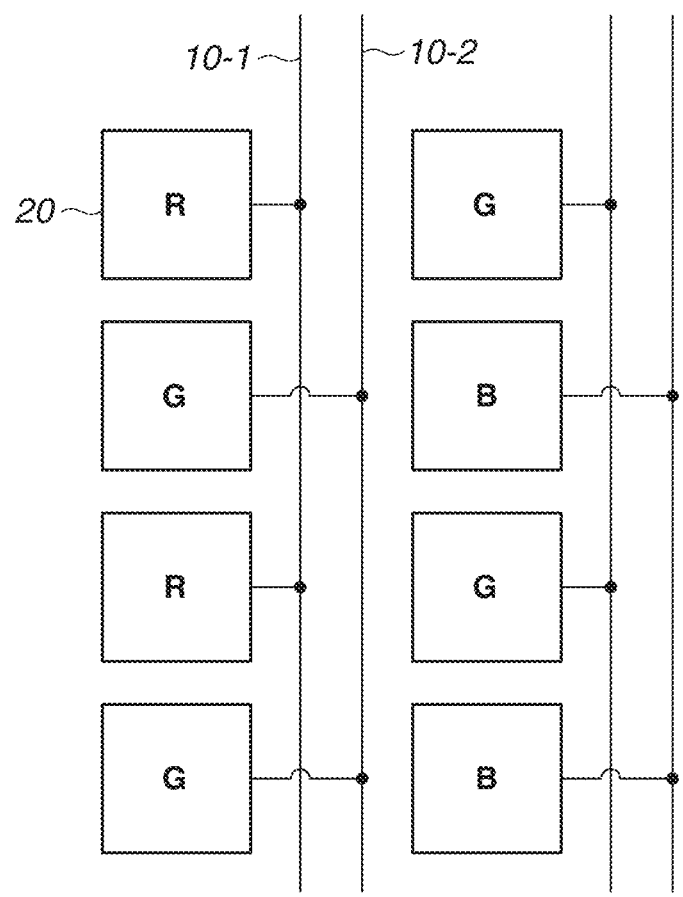
FIG. 14 illustrates the layout of color filters in pixels included in the photoelectric conversion apparatus according to the fourth exemplary embodiment.

FIG. 11 is an enlarged plan view of a single pixel included in a photoelectric conversion apparatus according to the present exemplary embodiment. FIG. 12 is an equivalent circuit diagram illustrating the photoelectric conversion apparatus according to the present exemplary embodiment. FIG. 13 is a cross-sectional view of a region through which a C-C' line illustrated in FIG. 11 runs, the cross-sectional view perpendicular to a first surface (the front surface or the upper surface) of a semiconductor substrate 60. FIG. 14 illustrates the arrangement of color filters in pixels.

The photoelectric conversion apparatus according to the present exemplary embodiment has a structure similar to that of the photoelectric conversion apparatus according to the first exemplary embodiment, except that the structure of each pixel 20 is different. Thus, the structure of each pixel 20 will be mainly described here.

In the photoelectric conversion apparatus according to the first exemplary embodiment, the pixel array 100 includes a plurality of pixels 20 for which a single vertical output line 10 per column is disposed. On the other hand, in the present exemplary embodiment, as illustrated in FIG. 11, the pixel array 100 includes a plurality of pixels 20 for which two vertical output lines 10-1 and 10-2 per column are disposed. The number of vertical output lines disposed for pixels 20 in a single column is not limited to one or two, and may be three or more.

As illustrated in FIGS. 11 and 13, a part of each of the vertical output lines 10-1 and 10-2 is disposed at a position overlapping the gate of an amplification transistor M4. A shield wire 6 is provided between the gate of the amplification transistor M4 and the vertical output lines 10-1 and 10-2. A connection wire (not illustrated) extending in the direction in which the vertical output lines 10-1 and 10-2 extend is connected to the shield wire 6. The connection wire is a wire connecting the amplification transistor M4 and a selection transistor M5. The shield wire 6 is connected to the source of the amplification transistor M4 by a contact CT1. Thus, the potential of the source of the amplification transistor M4 is supplied to the shield wire 6.

In each of the pixels 20 to which the vertical output line 10-1 is connected, at least a part of the gate of the amplification transistor M4, the shield wire 6, and the vertical output line 10-2 overlap one another in a planar view.

In each of the pixels 20 to which the vertical output line 10-2 is connected, at least a part of the gate of the amplification transistor M4, the shield wire 6, and the vertical output line 10-1 overlap one another in a planar view.

FIG. 11 illustrates the state where in both the pixel 20 to which the vertical output line 10-1 is connected and the pixel 20 to which the vertical output line 10-2 is connected, the entirety of the gate of the amplification transistor M4, the shield wire 6, and the vertical output line 10-1 or 10-2 overlap one another.

FIG. 12 is an equivalent circuit diagram illustrating the circuits of two of the pixels 20 illustrated in FIG. 11. An electric current source (not illustrated) is connected to each of the vertical output lines 10-1 and 10-2. A signal pSEL(m) reaches an active level, turning on the selection transistor M5 of a pixel 20 in an m-th row. This allows an electric current to be supplied from the electric current source to the amplification transistor M4 of the pixel 20 in the m-th row. In the pixel 20 in the m-th row, a source follower circuit is formed of a power supply voltage VDD, the amplification transistor M4, and the electric current source (not illustrated) connected to the vertical output line 10-1. The formation of the source follower circuit allows the amplification transistor M4 to output a signal based on the potential of a charge conversion unit C1 to the vertical output line 10-1 via the transistor M5.

A signal pSEL(m+1) reaches an active level, turning on the selection transistor M5 of a pixel 20 in an m+1-th row. This allows an electric current to be supplied from the electric current source to the amplification transistor M4 in the m+1-th row. In the pixel 20 in the m+1-th row, a source follower circuit is formed of a power supply voltage VDD, the amplification transistor M4, and the electric current source (not illustrated) connected to the vertical output line 10-2. The formation of the source follower circuit allows the amplification transistor M4 to output a signal based on the potential of a charge conversion unit C1 to the vertical output line 10-2 via the transistor M5.

As described above, the pixel 20 in the m-th row and the pixel 20 in the m+1-th row are connected to the vertical output lines 10-1 and 10-2, respectively, that are different from each other.

In FIG. 13, the gate of a transfer transistor M1 and the gate of the amplification transistor M4 are provided on the front surface of the semiconductor substrate 60. The shield wire 6 is provided between the gate of the amplification transistor M4 and the vertical output lines 10-1 and 10-2.

An insulating layer 50 is provided between the vertical output lines 10-1 and 10-2 and the shield wire 6. An insulating layer 55 is provided between the shield wire 6 and the gate of the amplification transistor M4. As illustrated in FIG. 11, the selection transistor M5 of the pixel 20 is connected to the vertical output line 10-1 (a first output line) via a connection portion 70. The shield wire 6 is provided in a first wiring layer separated by the insulating layer 55 between the vertical output line 10-2 (a second output line) different from the vertical output line 10-1 and the gate of the amplification transistor M4. The shield wire 6 lies above the gate of the amplification transistor M4. The shield wire 6 is connected to the source that is the output node of the amplification transistor M4. That is, the shield wire 6 is a wire which is disposed above the input node of the amplification transistor M4 and to which the output node of the amplification transistor M4 is connected. The vertical output lines 10-1 and 10-2 are provided in a second wiring layer separated from the shield wire 6 by the insulating layer 50.

As illustrated in FIG. 11, in some cases, the amplification transistor M4 of the other pixel 20 outputs a signal to the vertical output line 10-2 during the period when the amplification transistor M4 of the pixel 20 connected to the vertical output line 10-1 via the connection portion 70 outputs a signal to the vertical output line 10-1. Without the shield wire 6, capacitive coupling caused by the parasitic capacitance between the vertical output line 10-2 and the gate of the amplification transistor M4 of the pixel 20 connected to the vertical output line 10-1 is large. This capacitive coupling causes the potential of the charge conversion unit C1 of the pixel 20 connected to the vertical output line 10-1 to fluctuate. That is, a signal output from a first pixel between the two pixels 20 mixes with a signal output from a second pixel between the two pixels 20. This mixture reduces the signal accuracy of the signal output from the first pixel. Similarly, the signal output from the second pixel also mixes with the signal output from the first pixel. Thus, this mixture also reduces the signal accuracy of the signal output from the second pixel.

The mixture of the signals between the pixels causes color mixture with different colors of color filters arranged in the pixels 20 connected to the vertical output lines 10-1 and 10-2 from one another.

FIG. 14 illustrates the arrangement of color filters in the photoelectric conversion apparatus according to the present exemplary embodiment. "R", "G", and "B" illustrated in FIG. 14 refer to red, green, and blue color filters, respectively.

The pixel 20 (the first pixel) connected to the vertical output line 10-1 (the first output line) corresponding to the first pixel column from the left in FIG. 14 includes a red color filter. The pixel 20 (the second pixel) connected to the vertical output line 10-2 (the second output line) corresponding to the same pixel column includes a green color filter. The pixel 20 including the green color filter outputs a signal to the vertical output line 10-2 during the period when the pixel 20 including the red color filter outputs a signal to the vertical output line 10-1. Thus, without the shield wire 6, the signal output from the pixel 20 including the red color filter and the signal output from the pixel 20 including the green color filter become crossed, causing color mixture.

The photoelectric conversion apparatus according to the present exemplary embodiment includes the shield wire 6. This configuration can reduce the parasitic capacitance between the gate of the amplification transistor M4 and the vertical output line 10-2 in the pixel 20 that outputs a signal to the vertical output line 10-1. The capacitive coupling between the gate of the amplification transistor M4 and the vertical output line 10-2 is reduced, making a signal from the other pixel 20 less likely to be mixed with. Similarly, a signal from the other pixel 20 is also less likely to be mixed with in the pixel 20 that outputs a signal to the vertical output line 10-2.

Further, in the photoelectric conversion apparatus according to the present exemplary embodiment, the shield wire 6 is connected to the output node of the amplification transistor M4. This allows the potentials of the shield wire 6 and the FD wire 7 to fluctuate in phase.

In this configuration, the output of the amplification transistor M4 follows the voltage on the FD, producing a substantially small parasitic capacitance of the FD wire 7. This configuration has the effect of suitably reducing the capacitive coupling between the vertical output line 10-2 and the gate of the amplification transistor M4 without adding a wire for supplying a potential to the shield wire 6.

A fifth exemplary embodiment of the disclosure will be described with reference to FIGS. 15A, 15B, and 16.

Figure 15A:
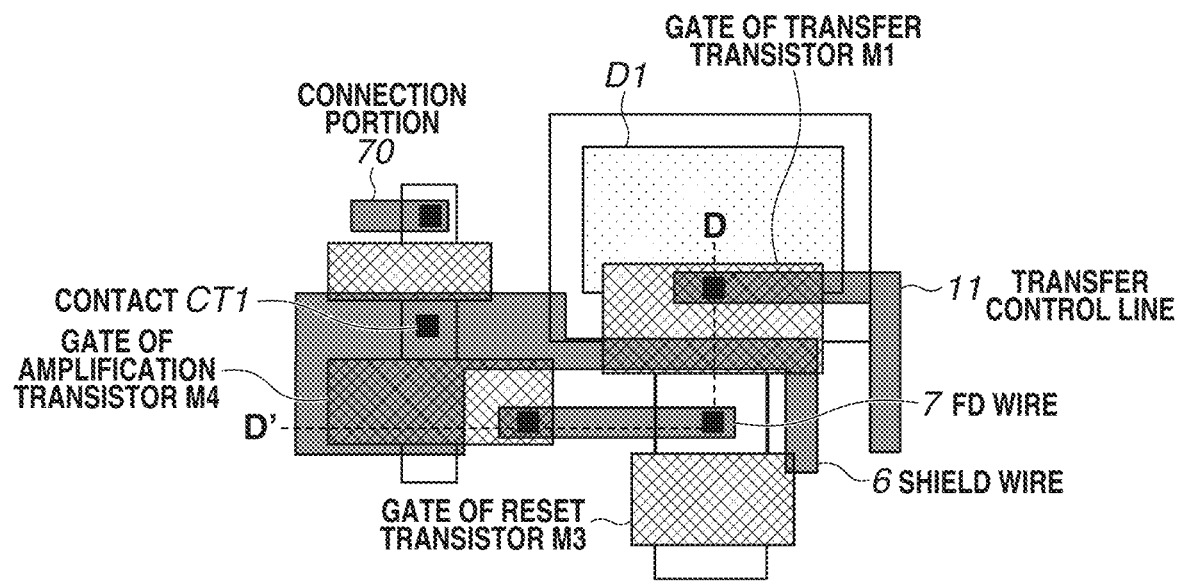
FIGS. 15A and 15B are plan views illustrating a photoelectric conversion apparatus according to a fifth exemplary embodiment.
Figure 15B:
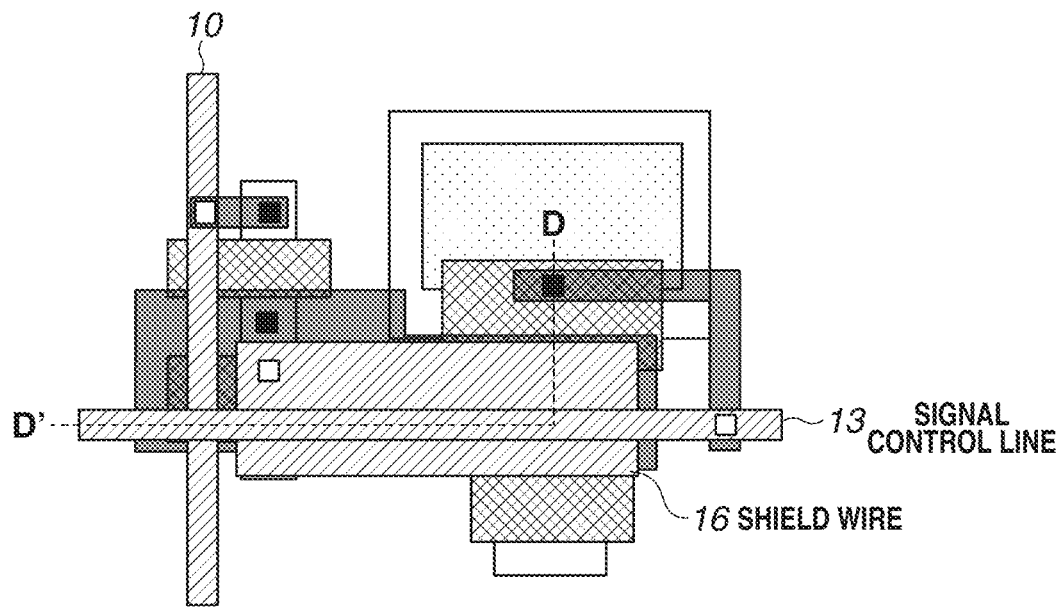

FIGS. 15A and 15B are enlarged plan views of a single pixel according to the present exemplary embodiment.

FIG. 16 is a cross-sectional view of a region through which a D-D' line illustrated in FIGS. 15A and 15B runs, the cross-sectional view perpendicular to a first surface (the front surface or the upper surface) of a semiconductor substrate 60. A photoelectric conversion apparatus according to the present exemplary embodiment has a structure similar to that of the photoelectric conversion apparatus according to the first exemplary embodiment, except that the structure of each pixel 20 is different. Thus, the structure of each pixel 20 will be mainly described here.

FIG. 15A illustrates a Si substrate, a contact plug, and wiring in the first layer in the enlarged plan view of the single pixel according to the present exemplary embodiment. FIG. 15B illustrates wiring in the second and third layers in the enlarged plan view of the single pixel according to the present exemplary embodiment.

In the photoelectric conversion apparatus according to the first exemplary embodiment, nothing is placed immediately above the FD wire 7. The present exemplary embodiment is different from the first exemplary embodiment in that as illustrated in FIGS. 15A and 15B, a shield wire 16 and a signal control line 13 are placed immediately above an FD wire 7. The signal control line 13 is connected to the gate of a transfer transistor M1 via a transfer control line 11.

In FIG. 16, the gate of the transfer transistor M1 and the gate of an amplification transistor M4 are provided on the front surface (the first surface) of the semiconductor substrate 60. A shield wire 6 (a first shield wire) is provided between a vertical output line 10 and the transfer control line 11, and the FD wire 7. The shield wire 6 is provided in the same wiring layer as a wiring layer in which the FD wire 7 that includes a charge conversion unit C1 is provided. The shield wire 16 (a second shield wire) is provided between the signal control line 13 and the FD wire 7. The shield wire 16 is provided in a second wiring layer different from the first wiring layer that is the wiring layer of the FD wire 7 that includes the charge conversion unit C1. The second wiring layer is at a position higher than that of the first wiring layer. The signal control line 13 is provided in a third wiring layer even higher than the second wiring layer.

An insulating layer 55 is provided between the shield wire 6 and the gate of the amplification transistor M4. The shield wire 6 is provided in the first wiring layer located over at least a part of the gate of the amplification transistor M4. The vertical output line 10 is provided in the second wiring layer separated from the shield wire 6 by an insulating layer 50. That is, the shield wire 6 is separated from the vertical output line 10 by the insulating layer 50.

In the present exemplary embodiment, as illustrated in FIGS. 15A and 15B, the shield wire 16 is placed between the FD wire 7 and the signal control line 13. This configuration allows reduction of the parasitic capacitance between the FD wire 7 and the signal control line 13 as compared with a case where the shield wire 16 is not provided. Thus, the configuration with the shield wire 16 provided as described above has the effect of reducing the capacitance of the charge conversion unit C1, increasing the charge conversion efficiency of the FD, reducing random noise superimposed on an output signal.

On the other hand, with the shield wire 16 provided, parasitic capacitance occurs between the shield wire 16 and the FD wire 7 in some cases. If this parasitic capacitance causes a large capacitance of the charge conversion unit C1, which is obtained by adding up the floating diffusion capacitance that is the wiring capacitance of the FD wire 7 and the parasitic capacitance, that will reduce the charge conversion efficiency of the FD, and increase random noise superimposed on an output signal.

For this reason, in the present exemplary embodiment, the shield wire 16 is connected to the output node of the amplification transistor M4 via the shield wire 6. That is, this makes the potential of the output node of the amplification transistor M4 the potential of the shield wire 16. In other words, in the second wiring layer, a wire having a potential different from those of the FD wire 7 and the shield wire 16 is not placed between the FD wire 7 and the shield wire 16. This configuration can reduce or eliminate the parasitic capacitance between the shield wire 16 and the FD wire 7, improving the effect of the charge conversion efficiency due to a reduction in the capacitance of the charge conversion unit C1, reducing the effect of random noise superimposed on an output signal.

In the present exemplary embodiment, the shield wire 16 is connected to the output node of the amplification transistor M4 via the shield wire 6. This configuration causes the potentials of the shield wire 16 and the FD wire 7 to fluctuate in phase. In this configuration, the output of the amplification transistor M4 follows the voltage on the FD, producing a substantially small parasitic capacitance of the FD wire 7. Thus, the present exemplary embodiment has the effect of suitably reducing the parasitic capacitance between the FD wire 7 and the signal control line 13 without adding a wire for supplying a potential to the shield wire 16.

In the present exemplary embodiment, an example has been illustrated where the shield wire 16 shields the FD wire 7 from the signal control line 13 connected to the gate of the transfer transistor M1 via the transfer control line 11. The placement of the shield wire 16 is not limited to this. In other embodiments, the shield wire 16 shields the FD wire 7 from a control line that transmits a reset signal to a reset transistor M3 or a control line that transmits a selection signal to a selection transistor M5.

Figure 17:
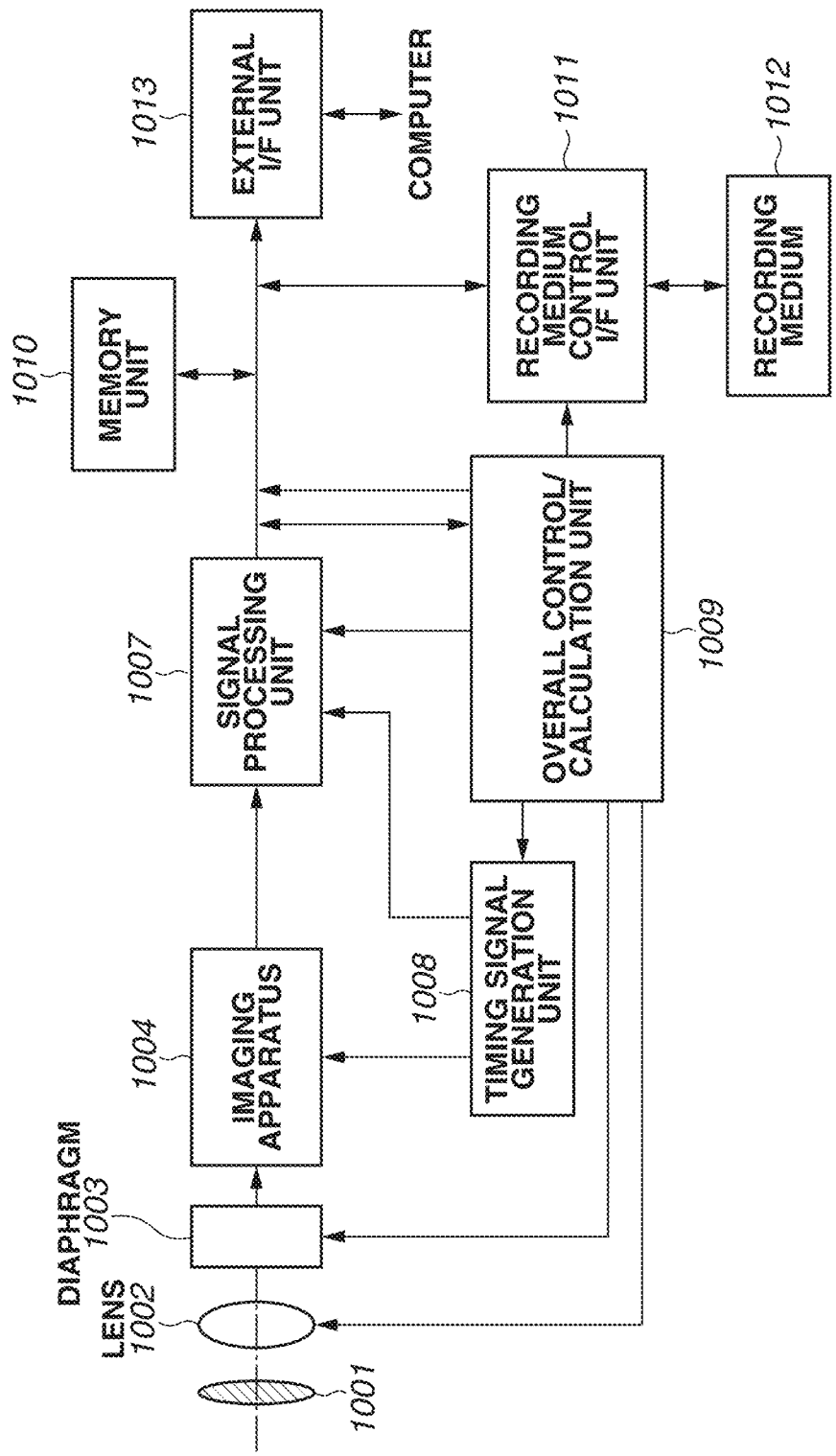
FIG. 17 illustrates the configuration of a photoelectric conversion system according to a sixth exemplary embodiment.

A photoelectric conversion system according to a sixth exemplary embodiment will be described with reference to FIG. 17. FIG. 17 is a block diagram illustrating the general configuration of the photoelectric conversion system according to the present exemplary embodiment.

The photoelectric conversion apparatus described in each of the first to fifth exemplary embodiments is applicable to various photoelectric conversion systems. Examples of the various photoelectric conversion systems include a digital still camera, a digital camcorder, a monitoring camera, a copying machine, a fax, a mobile phone, an in-vehicle camera, and an observation satellite. The various photoelectric conversion systems also include a camera module including an optical system such as a lens and an imaging apparatus. FIG. 17 illustrates a block diagram of a digital still camera as one of these examples.

The photoelectric conversion system illustrated in FIG. 17 includes an imaging apparatus 1004, which is an example of the photoelectric conversion apparatus, and a lens 1002 that forms an optical image of an object on the imaging apparatus 1004. Further, the photoelectric conversion system includes a diaphragm 1003 that varies the amount of light passing through the lens 1002, and a barrier 1001 that protects the lens 1002. The lens 1002 and the diaphragm 1003 constitutes an optical system for collecting light on the imaging apparatus 1004. The imaging apparatus 1004 is the photoelectric conversion apparatus according to any of the above exemplary embodiments and converts the optical image formed by the lens 1002 into an electric signal.

The photoelectric conversion system according to the present exemplary embodiment includes a signal processing unit 1007 that is an image generation unit that processes an output signal (an imaging signal) output from the imaging apparatus 1004, thereby generating an image. The signal processing unit 1007 performs an operation for performing various types of correction and compression as appropriate and outputting image data. The signal processing unit 1007 may be formed on a semiconductor substrate included in the imaging apparatus 1004, or on a semiconductor substrate different from the semiconductor substrate included in the imaging apparatus 1004.

The photoelectric conversion system according to the present exemplary embodiment includes a memory unit 1010 that temporarily stores image data, and an external interface unit (external I/F unit) 1013 used to communicate with an external computer. Further, the photoelectric conversion system includes a recording medium 1012 such as a semiconductor memory in or from which image data is recorded or read, and a recording medium control interface unit (recording medium control I/F unit) 1011 used to record or read image data in or from the recording medium 1012. The recording medium 1012 is attachable to and detachable from the photoelectric conversion system, but may not be attachable to and detachable from the photoelectric conversion system.

Further, the photoelectric conversion system according to the present exemplary embodiment includes an overall control/calculation unit 1009 that performs various calculations and also generally controls the digital still camera, and a timing signal generation unit 1008 that outputs various timing signals to the imaging apparatus 1004 and the signal processing unit 1007. The timing signals may be input from outside, and the photoelectric conversion system includes at least the imaging apparatus 1004 and the signal processing unit 1007 that processes an output signal output from the imaging apparatus 1004.

As described above, according to the present exemplary embodiment, a photoelectric conversion system can be configured to which the photoelectric conversion apparatus (the imaging apparatus) according to any of the above exemplary embodiments is applied.

Figure 18A:
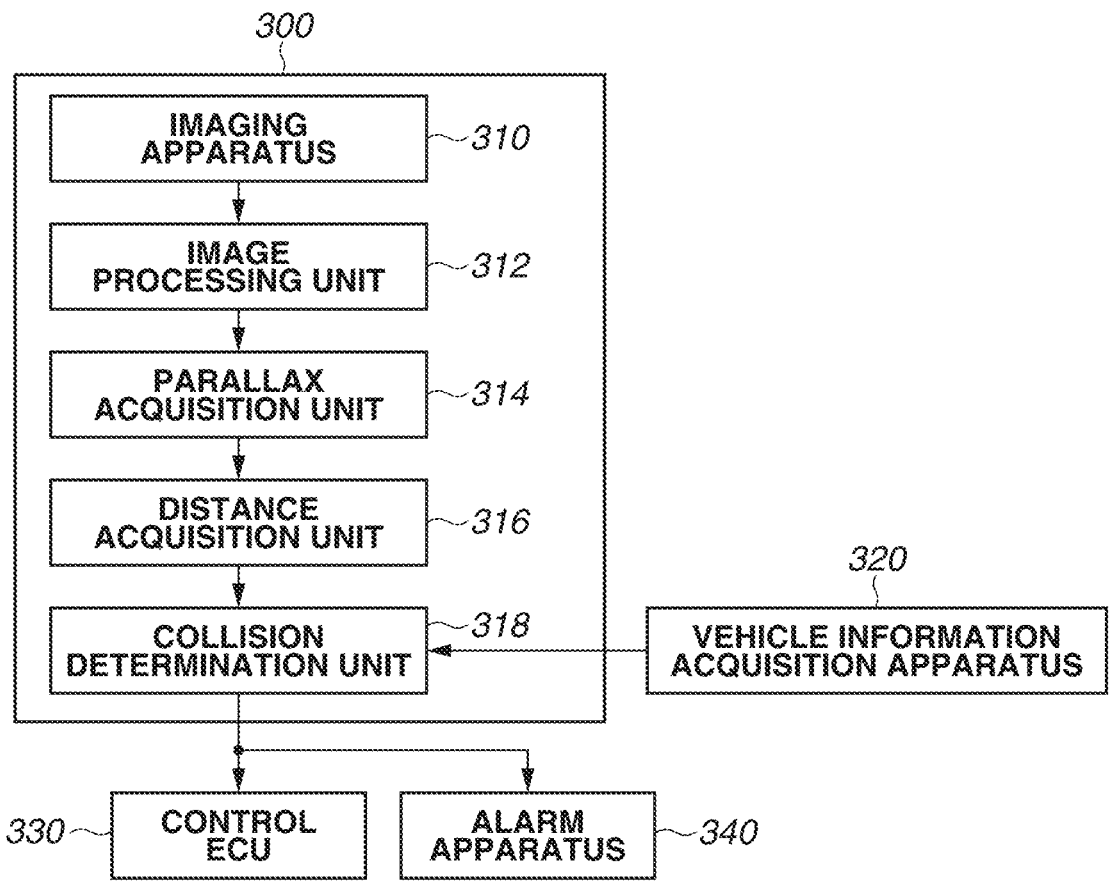
FIGS. 18A and 18B illustrate a configuration and an operation of a moving body according to a seventh exemplary embodiment.
Figure 18B:
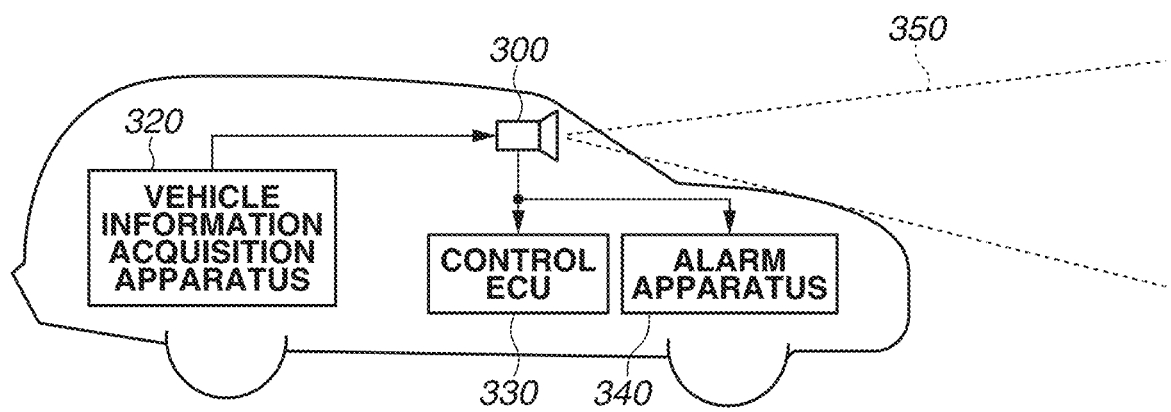

A photoelectric conversion system and a moving body according to a seventh exemplary embodiment will be described with reference to FIGS. 18A and 18B. FIGS. 18A and 18B illustrate configurations of the photoelectric conversion system and the moving body according to the present exemplary embodiment.

FIG. 18A illustrates an example of a photoelectric conversion system regarding an in-vehicle camera. A photoelectric conversion system 300 includes an imaging apparatus 310. The imaging apparatus 310 is the photoelectric conversion apparatus (the imaging apparatus) according to any of the above exemplary embodiments. The photoelectric conversion system 300 includes an image processing unit 312 that generates image data using an imaging signal from the imaging apparatus 310 and performs image processing on the image data, and a parallax acquisition unit 314 that calculates a parallax (the phase difference between parallax images) from the image data from the image processing unit 312. The photoelectric conversion system 300 also includes a distance acquisition unit 316 that calculates the distance from a target object based on the calculated parallax, and a collision determination unit 318 that, based on the calculated distance, determines whether there is a possibility of a collision. The parallax acquisition unit 314 and the distance acquisition unit 316 are examples of a distance information acquisition unit for acquiring distance information regarding the distance from a target object. That is, the distance information is information regarding the parallax, the amount of defocus, and the distance from the target object. Using any of these pieces of distance information, the collision determination unit 318 may determine the possibility of a collision. The distance information acquisition unit may be formed of hardware designed exclusively for the distance information acquisition unit, or may be formed of a software module. Alternatively, the distance information acquisition unit may be implemented by a field-programmable gate array (FPGA) or an application-specific integrated circuit (ASIC), or a combination of these.

The photoelectric conversion system 300 is connected to a vehicle information acquisition apparatus 320 and can acquire vehicle information such as the speed of the vehicle, the yaw rate, and the steering angle. The photoelectric conversion system 300 is also connected to a control electronic control unit (ECU) 330 that is a control unit that produces a braking force in the vehicle based on the determination result of the collision determination unit 318. The photoelectric conversion system 300 is also connected to an alarm apparatus 340 that gives an alarm to a driver based on the determination result of the collision determination unit 318. For example, if there is a high possibility of a collision as the determination result of the collision determination unit 318, the control ECU 330 applies a brake, returns the gas pedal, or reduces the engine output, thereby controlling the vehicle to avoid a collision and reduce damage. The alarm apparatus 340 warns a user by setting off an alarm such as sound, displaying alarm information on a screen of an automotive navigation system, or creating a vibration on a seat belt or the steering.

In the present exemplary embodiment, the photoelectric conversion system 300 captures the periphery of the vehicle, such as the front direction or the rear direction. FIG. 18B illustrates a photoelectric conversion system to capture the front direction of the vehicle (an imaging range 350). The vehicle information acquisition apparatus 320 sends an instruction to the photoelectric conversion system 300 or the imaging apparatus 310. Such a configuration further improves the accuracy of distance measurement.

In the above description, an example has been described where a vehicle is controlled to avoid colliding with another vehicle. Alternatively, the present exemplary embodiment is also applicable to control to automatically drive a vehicle by following another vehicle, or control to automatically drive a vehicle so as to stay in a lane. Further, the photoelectric conversion system is applicable to a moving body (a moving apparatus) such as a vessel, an aircraft, or an industrial robot as well as to a vehicle such as an automobile. Additionally, the photoelectric conversion system is applicable to a device widely using object recognition, such as an intelligent transportation system (ITS), in addition to a moving body.

Modified Exemplary Embodiments

The disclosure is not limited to the above exemplary embodiments, and can be modified in various ways.

For example, the exemplary embodiments of the disclosure also include an example where the configuration of a part of any of the exemplary embodiments is added to another exemplary embodiment, and an example where the configuration of a part of any of the exemplary embodiments is replaced with the configuration of a part of another exemplary embodiment.

The photoelectric conversion systems according to the sixth and seventh exemplary embodiments illustrate examples of photoelectric conversion systems to which the photoelectric conversion apparatus according to any of the first to fifth exemplary embodiments is applicable. The photoelectric conversion system to which the photoelectric conversion apparatus according to the aspect of the embodiments is applicable is not limited to the configurations illustrated in FIGS. 17, 18A, and 18B.

All the above exemplary embodiments merely illustrate specific examples for carrying out the disclosure, and the technical scope of the disclosure should not be interpreted in a limited manner based on these exemplary embodiments. That is, the aspect of the embodiments can be carried out in various ways without departing from the technical idea or the main feature of the aspect of the embodiments.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-198651, filed Dec. 7, 2021, which is hereby incorporated by reference herein in its entirety.

What is claimed is:

1. An apparatus including a semiconductor layer including a conversion unit and a diffusion unit, and a plurality of wiring layers including a first wiring layer,
the semiconductor layer comprising:
a transfer transistor configured to send a signal based on a charge generated by the conversion unit to the diffusion unit; and
an amplification transistor including a gate connected to the diffusion unit,
the first wiring layer comprising:
a control line configured to send a signal to drive the transfer transistor to a gate of the transfer transistor;
a wire connecting the diffusion unit and the gate of the amplification transistor; and
a first shield wire connected to a source or a drain of the amplification transistor and provided between the wire and the control line in a planar view,
wherein the conversion unit includes a first conversion unit and a second conversion unit,
wherein the first conversion unit and the second conversion unit are disposed line-symmetrically across the diffusion unit,
wherein the gate of the transfer transistor includes a first gate configured to transfer a signal based on a charge generated by the first conversion unit and a second gate configured to transfer a signal based on a charge generated by the second conversion unit,
wherein the control line includes a first control line configured to transmit a signal to drive the first gate, and a second control line configured to transmit a signal to drive the second gate,
wherein the first shield wire is located between the wire and the first control line and between the wire and the second control line in a planar view in the first wiring layer,
wherein the first gate is located between the first conversion unit and the first control line,
wherein the first shield wire is provided in a region overlapping the first gate in a planar view, and
wherein the first shield wire is electrically isolated from the wire.

2. The apparatus according to claim 1, wherein the first shield wire is placed around the wire in a planar view.

3. The apparatus according to claim 1, wherein in the first wiring layer, a wire having a potential different from potentials of the wire and the first shield wire is not placed between the wire and the first shield wire.

4. The apparatus according to claim 1, wherein the first shield wire is provided in a region overlapping the gate of the amplification transistor in a planar view.

5. The apparatus according to claim 1,
wherein the plurality of wiring layers includes a second wiring layer, and
wherein the second wiring layer includes a second shield wire connected to the source or the drain of the amplification transistor and provided in a region overlapping the wire in a planar view.

6. The apparatus according to claim 5, wherein a wire having a potential different from potentials of the wire and the second shield wire is not placed between the wire and the second shield wire.

7. The apparatus according to claim 5, wherein the second shield wire is placed in a region overlapping the control line in a planar view.

8. The apparatus according to claim 5, wherein the first wiring layer is disposed at a position closer to the semiconductor layer than the second wiring layer is.

9. The apparatus according to claim 1,
wherein the plurality of wiring layers includes a third wiring layer including an output line, and
wherein the output line is connected to the source or the drain of the amplification transistor via a selection transistor.

10. The apparatus according to claim 9, wherein the output line includes a first output line and a second output line.

11. The apparatus according to claim 10, further comprising a first pixel connected to the first output line, and a second pixel connected to the second output line,
wherein a first color filter corresponding to a first color is disposed in the first pixel and a second color filter corresponding to a second color is disposed in the second pixel, the first color being different from the second color.

12. The apparatus according to claim 9, wherein the output line is placed in a region overlapping the first shield wire in a planar view.

13. A system comprising:
the apparatus according to claim 1; and
a processing unit configured to process a signal output from the apparatus.

14. The system according to claim 13, wherein in the first wiring layer, a wire having a potential different from potentials of the wire and the first shield wire is not placed between the wire and the first shield wire.

15. The system according to claim 13,
wherein the plurality of wiring layers includes a second wiring layer, and
wherein the second wiring layer includes a second shield wire connected to the source or the drain of the amplification transistor and provided in a region overlapping the wire in a planar view.

16. A moving body comprising:
the apparatus according to claim 1;

an acquisition unit configured to acquire distance information about a distance from a target object based on a signal from the apparatus; and a control unit configured to control the moving body based on the distance information.

17. The moving body according to claim 16, wherein in the first wiring layer, a wire having a potential different from potentials of the wire and the first shield wire is not placed between the wire and the first shield wire.

18. The moving body according to claim 16, wherein the plurality of wiring layers includes a second wiring layer, and wherein the second wiring layer includes a second shield wire connected to the source or the drain of the amplification transistor and provided in a region overlapping the wire in a planar view.

19. The apparatus according to claim 1, wherein the apparatus includes a first microlens, wherein the first microlens is provided in a region overlapping the first conversion unit and the second conversion unit in a planar view.

20. The apparatus according to claim 19, wherein the apparatus includes a second microlens, wherein the conversion unit includes a third conversion unit and a fourth conversion unit, wherein the third conversion unit and the fourth conversion unit are disposed line-symmetrically across the diffusion unit, wherein the gate of the transfer transistor includes a third gate configured to transfer a signal based on a charge generated by the third conversion unit and a fourth gate configured to transfer a signal based on a charge generated by the fourth conversion unit, wherein the control line includes the third control line configured to transmit a signal to drive the third gate, and the fourth control line configured to transmit a signal to drive the fourth gate, wherein the first shield wire is located between the wire and the third control line and between the wire and the fourth control line in a planar view in the first wiring layer, and wherein the second microlens is provided in a region overlapping the third conversion unit and the fourth conversion unit in a planar view.

21. The apparatus according to claim 1, wherein the semiconductor layer comprises the source or the drain of the amplification transistor.

22. The apparatus according to claim 1, wherein the gate of the transfer transistor is arranged on a surface of a semiconductor substrate.

23. The apparatus according to claim 1, wherein the gate of the transfer transistor and the gate of the amplification transistor are arranged on one surface of a semiconductor substrate.

24. An apparatus including a semiconductor layer including a conversion unit and a diffusion unit, and a plurality of wiring layers including a first wiring layer, the semiconductor layer comprising:

a transfer transistor configured to send a signal based on a charge generated by the conversion unit to the diffusion unit; and a source or a drain of an amplification transistor including a gate connected to the diffusion unit, the first wiring layer comprising:

a control line configured to send a signal to drive the transfer transistor to a gate of the transfer transistor;

a wire connecting the diffusion unit and the gate of the amplification transistor; and a first shield wire connected to the source or the drain of the amplification transistor and provided between the wire and the control line in a planar view, wherein the conversion unit includes a first conversion unit and a second conversion unit, wherein the first conversion unit and the second conversion unit are disposed line-symmetrically across the diffusion unit, wherein the gate of the transfer transistor includes a first gate configured to transfer a signal based on a charge generated by the first conversion unit and a second gate configured to transfer a signal based on a charge generated by the second conversion unit, wherein the control line includes a first control line configured to transmit a signal to drive the first gate, and a second control line configured to transmit a signal to drive the second gate, wherein the first shield wire is located between the wire and the first control line and between the wire and the second control line in a planar view in the first wiring layer, and wherein the gate of the transfer transistor and the gate of the amplification transistor are arranged on one surface of a semiconductor substrate.

* * * * *